United States Patent
Suk et al.

(10) Patent No.: US 9,806,194 B2
(45) Date of Patent: Oct. 31, 2017

(54) FINFET WITH FIN HAVING DIFFERENT GE DOPED REGION

(71) Applicant: SAMSUNG ELECTRONICS CO., LTD., Suwon-si, Gyeonggi-Do (KR)

(72) Inventors: Sung-Dae Suk, Seoul (KR); Kang-Ill Seo, Chungcheongbuk-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/800,054

(22) Filed: Jul. 15, 2015

(65) Prior Publication Data

US 2017/0018644 A1    Jan. 19, 2017

(51) Int. Cl.
*H01L 29/78* (2006.01)
*H01L 29/66* (2006.01)

(52) U.S. Cl.
CPC .... *H01L 29/7848* (2013.01); *H01L 29/66545* (2013.01); *H01L 29/66795* (2013.01); *H01L 29/7851* (2013.01)

(58) Field of Classification Search
CPC .................................................. H01L 29/7848
See application file for complete search history.

(56) References Cited

U.S. PATENT DOCUMENTS

| | | | | |
|---|---|---|---|---|
| 5,821,577 A * | 10/1998 | Crabbe | ............... | H01L 29/1029 257/191 |
| 7,018,901 B1 * | 3/2006 | Thean | ................. | H01L 21/2254 257/E21.148 |
| 7,109,516 B2 * | 9/2006 | Langdo | ............. | H01L 21/76254 257/18 |
| 7,791,146 B2 * | 9/2010 | Kim | ...................... | H01L 29/165 257/384 |
| 7,902,009 B2 * | 3/2011 | Simonelli | ......... | H01L 21/02381 438/166 |
| 2005/0133834 A1 | 6/2005 | Sorada et al. | | |
| 2006/0081896 A1 | 4/2006 | Maeda | | |
| 2008/0119031 A1 * | 5/2008 | Pal | ...................... | H01L 29/7848 438/483 |
| 2009/0194788 A1 | 8/2009 | Liu et al. | | |

(Continued)

FOREIGN PATENT DOCUMENTS

KR    100618313    8/2006

OTHER PUBLICATIONS

Joseph, J. "Impact of Fin Width and Graded Channel Doping on the Performance of 22nm SOI FinFET" VLSI Design and Test 17th Int. Symp. VDAT Jul. 2013 copyright 2013 pp. 153-159.*

(Continued)

*Primary Examiner* — Asok K Sarkar
*Assistant Examiner* — Grant Withers
(74) *Attorney, Agent, or Firm* — F. Chau & Associates, LLC

(57) ABSTRACT

A semiconductor device is provided. A fin is disposed on a substrate. The fin, including a first material and a second material, includes a first fin area and a second fin area. A gate structure is disposed on the first fin area. A source region is in contact with the second fin area. The first fin area includes the first material at a first concentration, the second fin area includes the first material at a second concentration which is greater than the first concentration.

19 Claims, 72 Drawing Sheets

(56) References Cited

U.S. PATENT DOCUMENTS

| | | | | |
|---|---|---|---|---|
| 2010/0144121 | A1* | 6/2010 | Chang | H01L 29/7851 |
| | | | | 438/478 |
| 2012/0003802 | A1 | 1/2012 | Chen et al. | |
| 2013/0105763 | A1 | 5/2013 | Yin et al. | |
| 2013/0149830 | A1 | 6/2013 | Rhee et al. | |
| 2013/0240836 | A1 | 9/2013 | Lee et al. | |
| 2013/0264639 | A1* | 10/2013 | Glass | H01L 21/28512 |
| | | | | 257/335 |
| 2015/0093868 | A1* | 4/2015 | Obradovic | H01L 21/82343 |
| | | | | 438/283 |
| 2015/0228648 | A1* | 8/2015 | Chi | H01L 27/0886 |
| | | | | 257/401 |
| 2015/0243756 | A1* | 8/2015 | Obradovic | H01L 29/66795 |
| | | | | 438/285 |
| 2015/0270344 | A1* | 9/2015 | Cheng | H01L 29/161 |
| | | | | 257/616 |

OTHER PUBLICATIONS

Tanaka, K. "Practical FinFET Design Considering GIDL for LSTP (Low Standby Power) Devices" Elec. Dev. Meet. 2005 IEDM Tech. Dig. IEEE Int. published online Apr. 3, 2006 pp. 1-4.*

Byun. H.S. "3-Dimensional Analysis on the GIDL Current of Body-tied Triple Gate FinFET" Sim. of Semi. Proc. and Dev. Int. Conf. 2006 published online Jan. 15, 2007 pp. 267-270.*

Kerber, P. "GIDL in Doped and Undoped FinFET Devices for Low-Leakage Applications" IEEE Elec. Dev. Lett. vol. 34, No. 1 Jan. 2013 pp. 6-8.*

* cited by examiner

FINFET WITH FIN HAVING DIFFERENT GE DOPED REGION

TECHNICAL FIELD

The present inventive concept relates to a semiconductor device and a method of fabricating the same.

DISCUSSION OF RELATED ART

As the feature size of a metal oxide semiconductor (MOS) transistor has been reduced, the length of a gate and the length of a channel formed therebelow are also gradually decreasing. Accordingly, various studies have been conducted to increase capacitance between the gate and the channel and to increase operating characteristics of the MOS transistor.

SUMMARY

According to an exemplary embodiment of the present inventive concept, a semiconductor device is provided. A fin is disposed on a substrate. The fin includes a first material and a second material. The fin includes a first fin area and a second fin area. A gate structure is disposed on the first fin area. A source region is in contact with the second fin area. The first fin area includes the first material at a first concentration, the second fin area includes the first material at a second concentration which is greater than the first concentration.

According to an exemplary embodiment of the present inventive concept, a semiconductor device is provided. A fin structure is disposed on a substrate. The fin structure, extending in a first direction, includes a channel region including a first material. A gate structure, extending in a second direction crossing the first direction, is disposed on the channel region. A source region including the first material is in contact with the channel region. A gate spacer is disposed on a sidewall of the gate structure and the source region. The channel region includes a first fin area and a second fin area. The first fin area and the second fin area are positioned under the gate structure and the gate spacer, respectively. The second fin area which is in contact with the source region extends in a direction which is perpendicular to the substrate. A concentration of the first material gradually decreases in the order of: the source region, the second fin area and the first fin area.

According to an exemplary embodiment of the present inventive concept, a method of fabricating a semiconductor device is provided. A fin is formed on a substrate. The fin, including a first material and a second material, is extended in a first direction. A dummy gate structure is formed on the fin and the substrate. The dummy gate structure is extended in a second direction crossing the first direction. The fin is partially removed using the dummy gate as an etch mask to form a first recessed fin area. The first recessed fin area is oxidized to form an oxide layer. The oxide layer is removed to form a recessed fin including a second recessed fin area. A source region is formed on the second recessed fin area.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
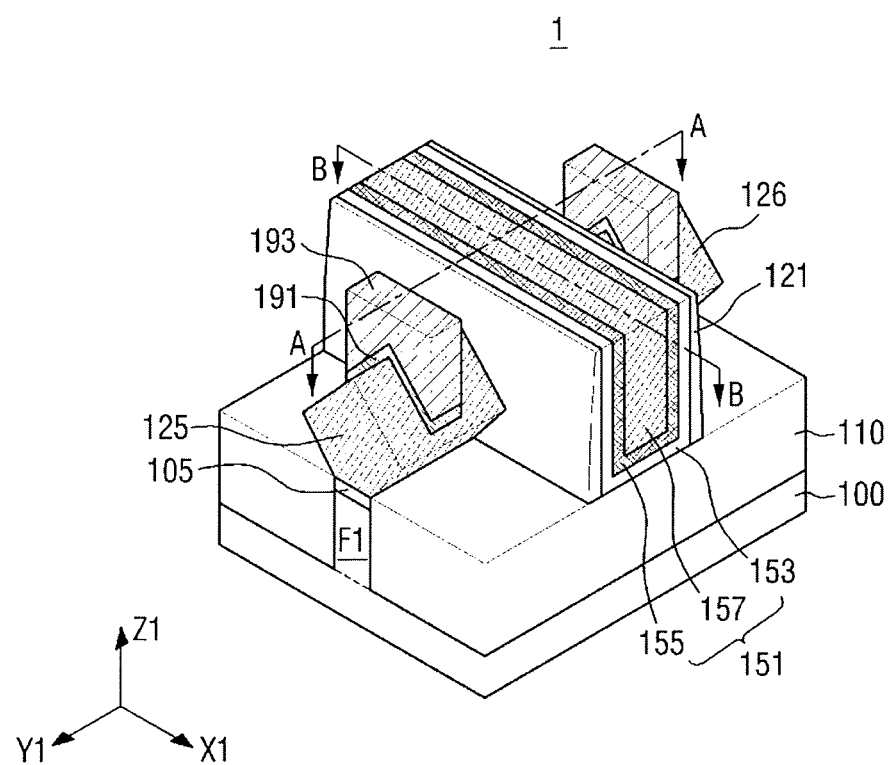
FIGS. 1 to 3 are diagrams of a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, a semiconductor device according to an embodiment of the present inventive concept will be described with reference to FIGS. 1 to 3.

Figure 2:
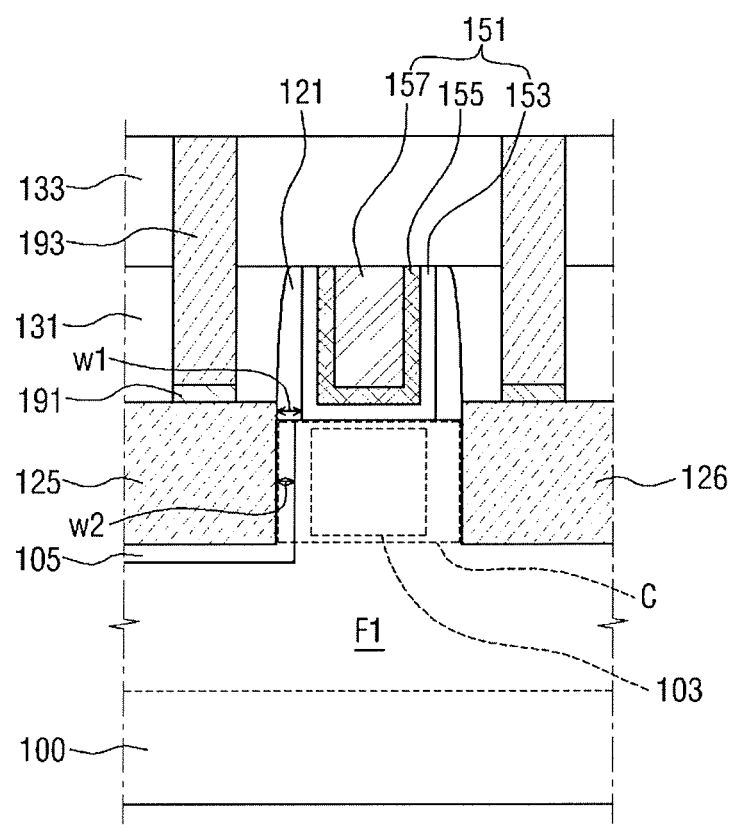
Figure 3:
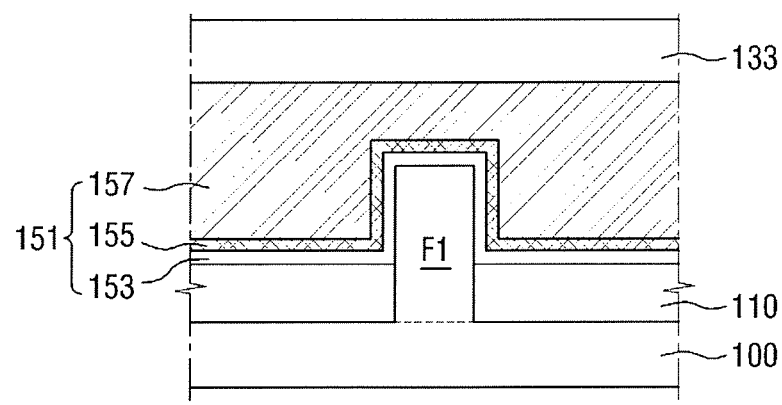

FIGS. 1 to 3 are diagrams of a semiconductor device 1 according to an embodiment of the present inventive concept. FIG. 1 is a perspective view of the semiconductor device 1 according to an embodiment of the present inventive concept, FIG. 2 is a cross-sectional view taken along line A-A of FIG. 1, and FIG. 3 is a cross-sectional view taken along line B-B of FIG. 1. First and second interlayer insulation films 131 and 133 are not shown in FIG. 1 for the convenience of description.

Referring to FIGS. 1 to 3, the semiconductor device 1 includes a substrate 100, a fin F1, a field insulation layer 110, a gate structure 151, a spacer 121, a source region 125, a drain region 126, a silicide layer 191, a contact 193, a first interlayer insulation film 131 and a second interlayer insulation film 133.

The fin F1 extends on the substrate 100 in a lengthwise direction, that is, in a second direction Y1. The fin F1 has long sides and short sides. In FIG. 1, the long side direction is a second direction Y1 and the short side direction is a first direction X1, but aspects of the present inventive concept are not limited thereto. For example, the fin F1 may have the first direction X1 as the long side direction and the second direction Y2 as the short side direction. The fin F1 protrudes from the substrate 100 in a third direction Z1.

The fin F1 may be a portion of the substrate 100 and may include an epitaxial layer grown from the substrate 100. The fin F1 may include a first material and a second material. The first material may have a larger lattice constant than the second material. For example, the first material may be Ge and the second material may be Si.

The fin F1 includes a channel region C positioned between the source region 125 and the drain region 126 and positioned under the gate structure 151.

The first fin area 103 and the second fin area 105 are disposed in the channel region C. The first fin area 103 is disposed in the channel region C, and the second fin area 105 is disposed between the first fin area 103 and the source region 125. The second fin area 105 is in contact with the source region 125.

The second fin area 105 is formed in the fin F1, surrounding the source region 105. For example, the second fin area 105 is positioned between first fin area 103 and the source region 125 in the channel region C, extending along sidewalls and a bottom surface of the source region 105 to surround the source region 105. The second fin area 105 is formed at a portion of the fin F1 being in contact with the source region 125, which will later be described.

The first fin area 103 and the second fin area 105 include a first material and a second material, respectively. Here, concentrations of the first material and the second material are different from each other.

A first concentration of the first material in the first fin area 103 may be smaller than a second concentration of the first material in the second fin area 105. In other words, the second concentration may be greater than the first concentration. In addition, a concentration of the second material in the second fin area 105 is smaller than a concentration of the second material in the first fin area 103.

The concentration of the first material in the second fin area 105 may be non-uniform. For example, the concentration of the first material is highest at a portion of the second fin area 105 being in contact with the source region 125 and lowest at a portion of the second fin area 105 being in contact with the first fin area 103. For example, in the second fin area 105, the second concentration gradually decreases from the portion being in contact with the source region 125 to the portion being in contact with the first fin area 103

Accordingly, in the second fin area 105, a concentration of the second material may gradually increase from the portion being in contact with the source region 125 to the portion being in contact with the first fin area 103.

The first material may be uniformly distributed at the first concentration in the first fin area 103. The second material in the first fin area 103 may be uniformly distributed in the first fin area 103.

When the channel region C includes the first material, mobility of carriers in the channel region C may be increased. Therefore, even if a transistor is scaled down, the mobility in the channel region C may be increased.

The substrate 100 may include the second material. For example, the substrate 100 may include a semiconductor material including Si or SiC. Alternatively, the substrate 100 may be a silicon on insulator (SOI) substrate. Like the fin F1, the substrate 100 may include the first material and the second material. For example, the substrate 100 may include a semiconductor material including SiGe or SiGeC.

The field insulation layer 110 is formed on the substrate 100, covering portions of sidewalls of the fin F1 while exposing a top portion of the fin F1.

The gate structure 151 is disposed on the fin F1, crossing the fin F1. For example, the gate structure 151 crosses the channel region C. In FIG. 1, the gate structure 151 extending in a first direction X1 is illustrated, but aspects of the present inventive concept are not limited thereto. The gate structure 151 may cross the fin F1 while forming an acute angle or an obtuse angle with respect to the fin F1.

The gate structure 151 includes gate electrodes 155 and 157 and a gate insulation layer 153.

The gate electrodes 155 and 157 include a first metal layer 155 and a second metal layer 157. As shown, the gate electrodes 155 and 157 may have a stacked structure having two or more metal layers 155 and 157 stacked one on the other. The first metal layer 155 may adjust a work function. The second metal layer 157 may fill a space formed by the first metal layer 155. For example, the first metal layer 155 may include at least one of TiAl, TiAlC, TiAlN, HfSi, TiN, TaN, TiC, and TaC. In addition, the second metal layer 157 may include W or Al. Alternatively, the gate electrodes 155 and 157 may include a non-metal material, such as Si or SiGe. The gate structure 151 may be formed by, for example, a replacement process, but aspects of the present inventive concept are not limited thereto.

The gate insulation layer 153 is formed between the fin F1 and each of the gate electrodes 155 and 157. As shown in FIG. 3, the gate insulation layer 153 is formed on a top surface and top portions of sidewalls of the fin F1. In addition, the gate insulation layer 153 is positioned between each of the gate electrodes 155 and 157 and the field insulation layer 110. The gate insulation layer 153 may have a high-k material having a higher dielectric constant than silicon oxide. The gate insulation layer 153 may include, for example, $HfO_2$, $ZrO_2$, LaO, $Al_2O_3$ or $Ta_2O_5$.

The spacer 121 is formed on the sidewalls of the gate structure 151. The spacer 121 may include at least one of a nitride layer and an oxynitride layer. The spacer 121 may include multiple layers.

The spacer 121 is formed on the second fin area 105. The spacer 121 is in contact with the second fin area 105. A width W1 of a portion of the spacer 121 being in contact with the second fin area 105 is greater than a width W2 of the second fin area 105. Since the width W2 of the second fin area 105 is smaller than the width W1 of the portion of the spacer 121 being in contact with the second fin area 105, the second fin area 105 is spaced apart from the gate structure 151.

Since the second fin area 105 includes the first material at the second concentration, carriers may have high mobility. Therefore, if the second fin area 105 is in contact with the gate structure 151, a probability of the short channel effect (SCE) occurring is increased. Therefore, the separation between the gate structure 151 and the second fin area 105 may suppress the SCE from occurring. The width W2 of the second fin area 105 is smaller than the width W1 of the portion of the spacer 121 being in contact with the second fin area 105.

Since the width W2 of the second fin area 105 is smaller than the width W1 of the portion of the spacer 121 being in contact with the second fin area 105, a width of the first fin area 103 is greater than a width of the gate structure 151.

The source region 125 and the drain region 126 are disposed at opposite sides of the gate structure 151. For example, the source region 125 is in contact with the second fin area 105 at one side of the gate structure 151 having the second fin area 105, and the drain region 126 is disposed at the other side of the gate structure 151. The source region 125 need not be in contact with the first fin area 103.

The source region 125 is an elevated source region, and the drain region 126 is an elevated drain region. Therefore, as shown in FIG. 2, top surfaces of the source region 125 and the drain region 126 are higher than a top surface of the fin F1.

The source region 125 and the drain region 126 may include the first material and the second material. However, the concentration of the first material in the source region 125 and the drain region 126 is different from the concentration of the first material in the second fin area 105. For example, the concentration of the first material in the source region 125 may be greater than the concentration of the first material in the second fin area 105, that is, the second concentration. Therefore, the concentration of the first material may gradually increase in the order from the first fin area 103 to the second fin area 105 and to the source region 125.

Conversely, the concentration of the second material may increase in the order from the source region 125 to the second fin area 105 and to the first fin area 103.

As will later be described, since the source region 125 and the drain region 126 are simultaneously formed, the concentration of the first material in the source region 125 may be substantially equal to the concentration of the first material in the drain region 126. Here, the meaning of the phrase "being substantially equal" may include not only sameness but a processing tolerance.

The source region 125 and the drain region 126 may be formed through epitaxial growth.

A silicide layer 191 is disposed on the source region 125 and the drain region 126. The silicide layer 191 may reduce contact resistance between the source region 125 and the contact 193 and between the drain region 126 and the contact 193. The silicide layer 191 may include, for example, Pt, Ni, Co, Au, or Al.

The contact 193 is formed on the silicide layer 191. The contact 193 penetrates through the first and second interlayer insulation films 131 and 133 to be in contact with the silicide layer 191. The contact 193 may include a conductive material, such as W, Al or Cu.

The contact 193 has a constant width from its bottom portion to its top portion, but aspects of the present inventive concept are not limited thereto. For example, the contact 193 may have upwardly increasing widths.

The first interlayer insulation film 131 and the second interlayer insulation film 133 are sequentially formed on the field insulation layer 110. The first interlayer insulation film 131 covers the silicide layer 191 and portions of sidewalls of the contact 193. The second interlayer insulation film 133 covers the remaining portions of the sidewalls of the contact 193.

As shown in FIG. 2, a top surface of the first interlayer insulation film 131 is coplanar with the top surface of the gate structure 151. Such planarization may be performed using a chemical-mechanical-planarization (CMP) process, or an etch-back process, for example. The second interlayer insulation film 132 covers the gate structure 151. The first interlayer insulation film 131 and the second interlayer insulation film 132 may include at least one of an oxide layer, a nitride layer and an oxynitride layer.

Next, a semiconductor device 2 according to an exemplary embodiment of the present inventive concept will be described with reference to FIGS. 4 and 5. The same content as described above will be omitted and the following description will focus on differences.

Figure 4:
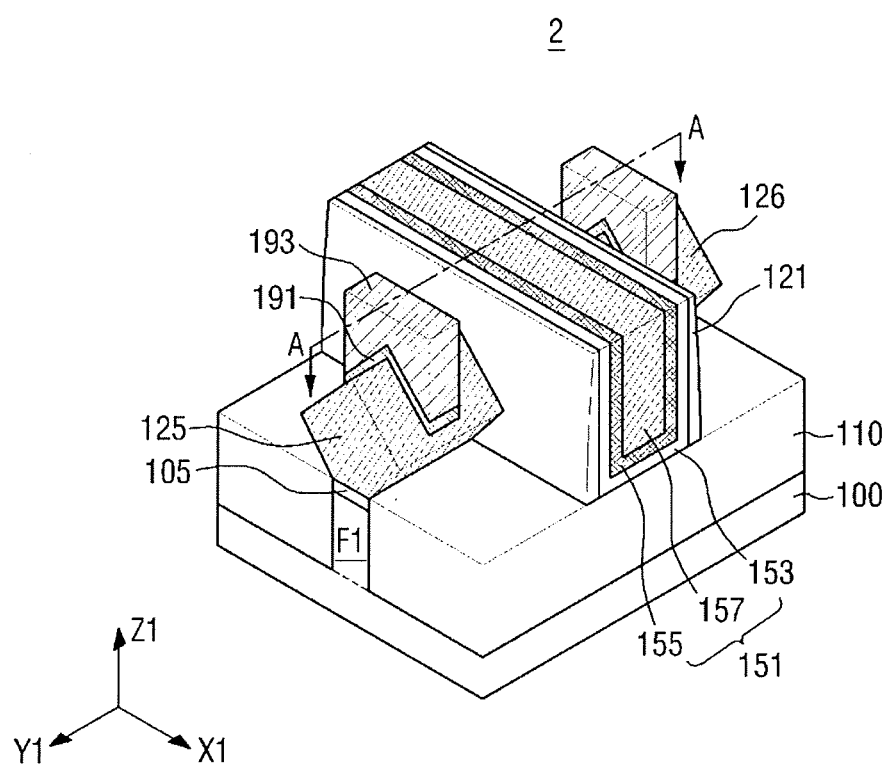
FIGS. 4 and 5 are diagrams of a semiconductor device according to an exemplary embodiment of the present inventive concept.
Figure 5:
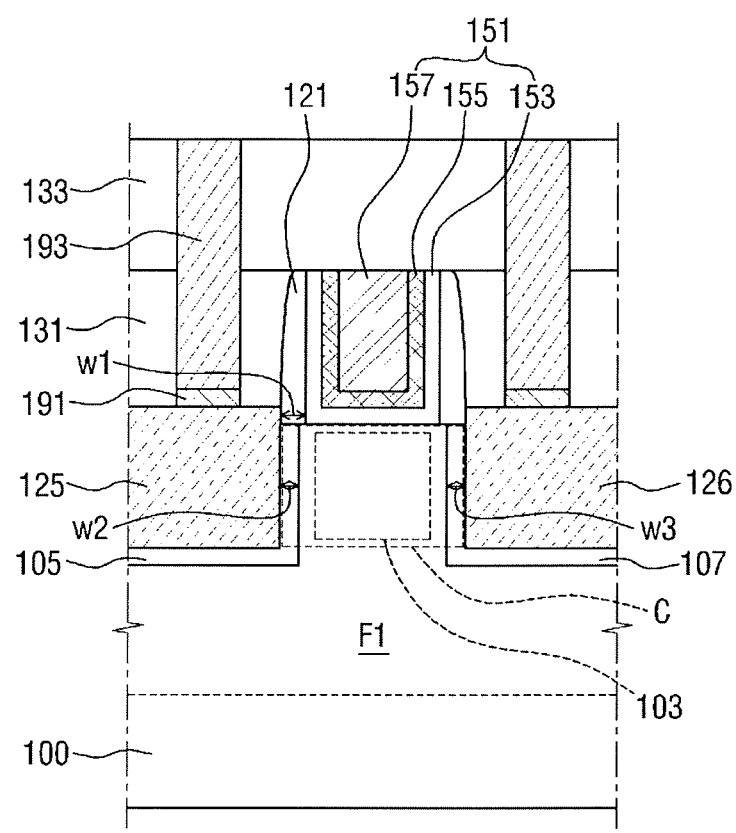

FIGS. 4 and 5 are diagrams of a semiconductor device 2 according to an exemplary embodiment of the present inventive concept. FIG. 4 is a perspective view of the semiconductor device 2 according to an exemplary embodiment of the present inventive concept, and FIG. 5 is a cross-sectional view taken along line A-A of FIG. 4. First and second interlayer insulation films 131 and 133 are not shown in FIG. 4 for the convenience of description.

The semiconductor device 2 of FIGS. 4 and 5 further includes a third fin area 107. For example, the channel region C includes a first fin area 103, a second fin area 105 and a third fin area 107. The first fin area 103 is positioned between the second fin area 105 and the third fin area 107. The third fin area 107 is spaced apart from the second fin area 105.

The third fin area 107 is disposed at the other side of the gate structure 151, contacting the drain region 126.

The third fin area 107 extends to surround the drain region 126 in the fin F1. The third fin area 107 is formed along sidewalls and a bottom surface of the drain region 126.

The third fin area 107 may include the first material and the second material. In the third fin area 107, a third concentration of the first material may be substantially equal to the second concentration. Therefore, the third concentration may be greater than the first concentration and may be smaller than the concentration of the first material in the drain region 126.

The concentration of the second material in the third fin area 107 may be smaller than the concentration of the second material in the first fin area 103 and may be greater than the concentration of the second material in the drain region 126.

The third fin area 107 is spaced apart from the gate structure 151. Therefore, a width W3 of the third fin area 107 is smaller than a width W1 of the spacer 121. The width of the gate structure 151 is smaller than the width of the first fin area 103.

Since the third fin area 106 is not in contact with the gate structure 151, the SCE may be suppressed.

Next, a semiconductor device 3 according to an exemplary embodiment of the present inventive concept will be described with reference to FIGS. 6 to 8. The same content as described above will be omitted and the following description will focus on differences.

Figure 6:
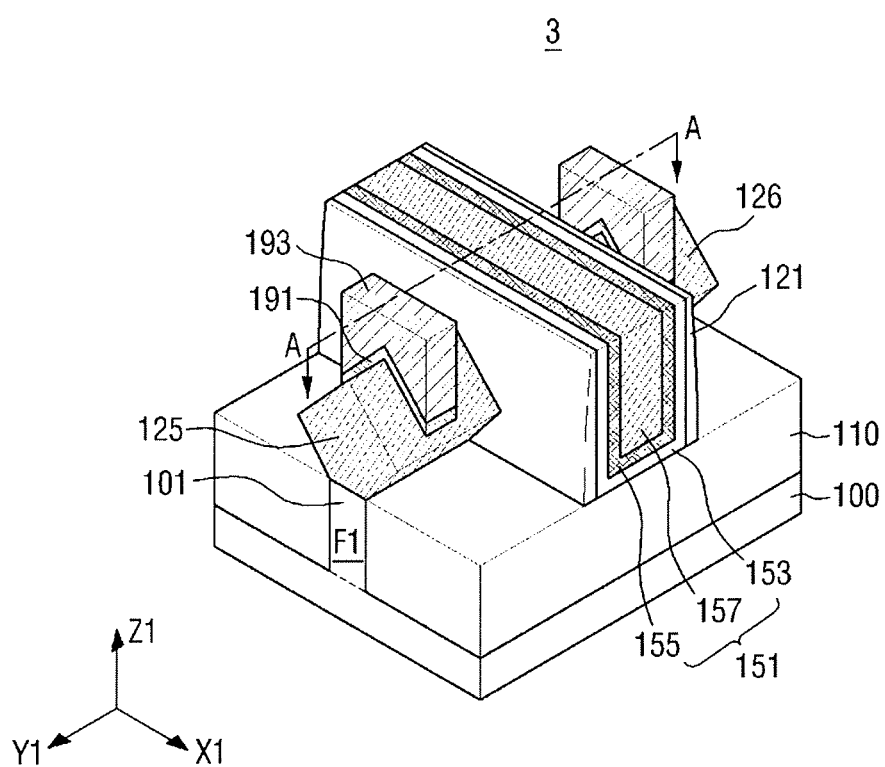
FIGS. 6 to 8 are diagrams of a semiconductor device according to an exemplary embodiment of the present inventive concept.
Figure 7:
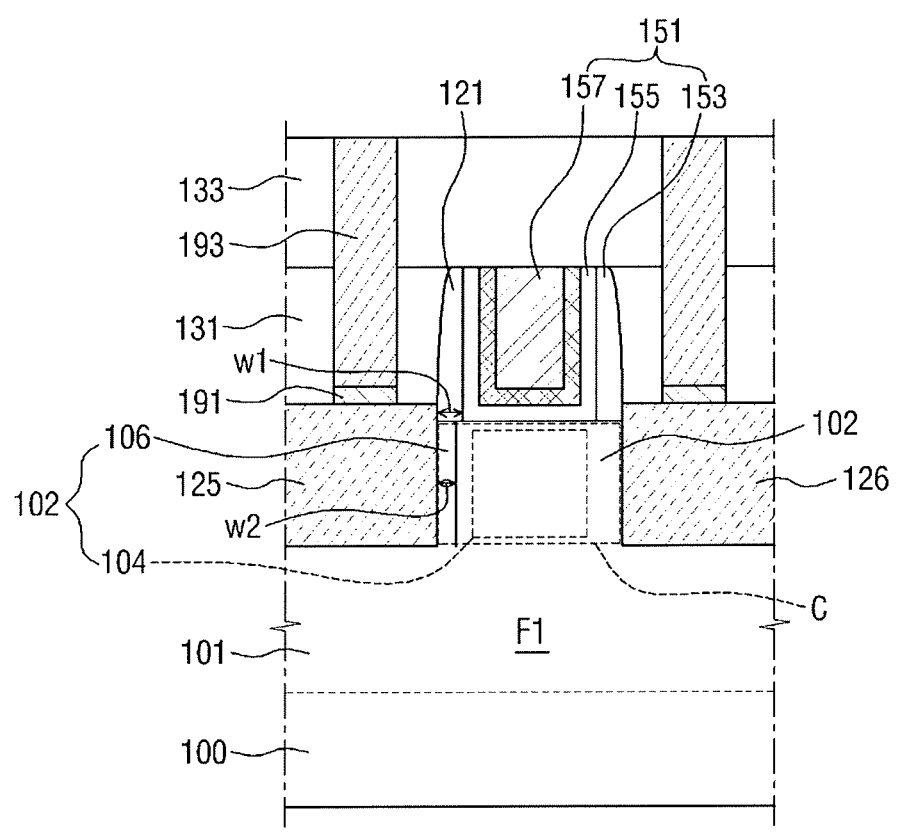
Figure 8:
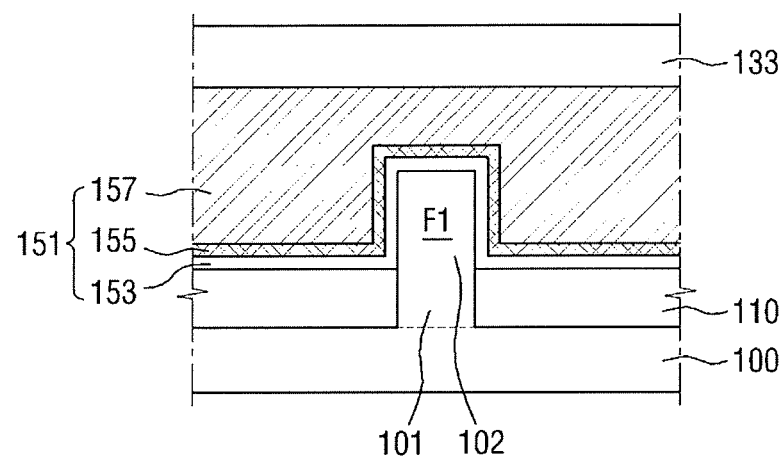

FIGS. 6 to 8 are diagrams of a semiconductor device 3 according to an exemplary embodiment of the present inventive concept. FIG. 6 is a perspective view of the semiconductor device 3 according to an exemplary embodiment of the present inventive concept, FIG. 7 is a cross-sectional view taken along line A-A of FIG. 6, and FIG. 8 is a cross-sectional view taken along line B-B of FIG. 6. First and second interlayer insulation films 131 and 133 are not shown in FIG. 6 for the convenience of description.

In the semiconductor device 3 of FIGS. 6 to 8, a fin F1 includes a lower region 101 and an upper region 102. The lower region 101 is positioned on a substrate 100. The upper region 102 is positioned on the lower region 101.

The first fin area 104 and the second fin area 106 are positioned in the upper region 102. The second fin area 106 is positioned between the first fin area 104 and the source region 125. The second fin area 106 extends in a third direction (Z1) substantially perpendicular to the substrate 100, contacting sidewalls of the source region 125.

The source region 125 and the drain region 126 are formed on the lower region 101, contacting the lower region 101.

The upper region 102 may include a first material and a second material. As described above, in the upper region 102, a second concentration of the first material in the second fin area 106 may be greater than a first concentration of the first material in the first fin area 104 and may be smaller than a concentration of the first material in the source region 125.

The lower region 101 may also include the first material and the second material. However, a concentration of the first material in the lower region 101 may be smaller than a concentration of the first material in the upper region 102. For example, the concentration of the first material in the lower region 101 may be smaller than the first concentration of the first fin area 104. In this case, the concentration of the second material in the lower region 101 may be greater than a concentration of the second material in the upper region 102, for example, the first fin area 104.

The lower region 101 may have a relatively low concentration of the first material, but the present inventive concept is not limited thereto. For example, the lower region 101 need not include the first material.

Next, a semiconductor device 4 according to an exemplary embodiment of the present inventive concept will be described with reference to FIGS. 9 and 10. The same content as described above will be omitted and the following description will focus on differences.

Figure 9:
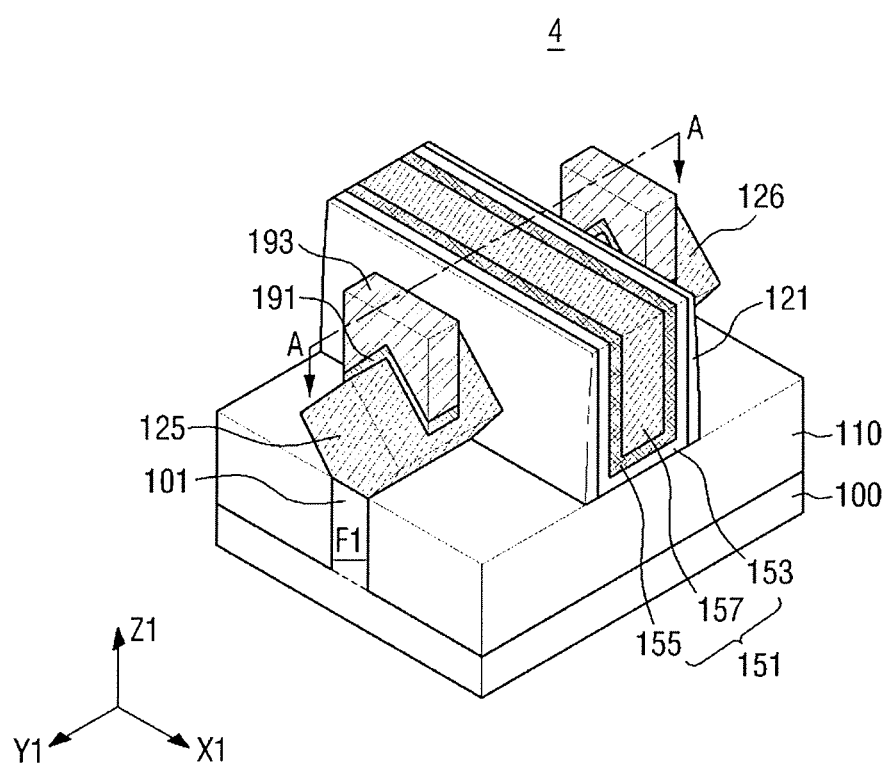
FIGS. 9 and 10 are diagrams of a semiconductor device according to an exemplary embodiment of the present inventive concept.
Figure 10:
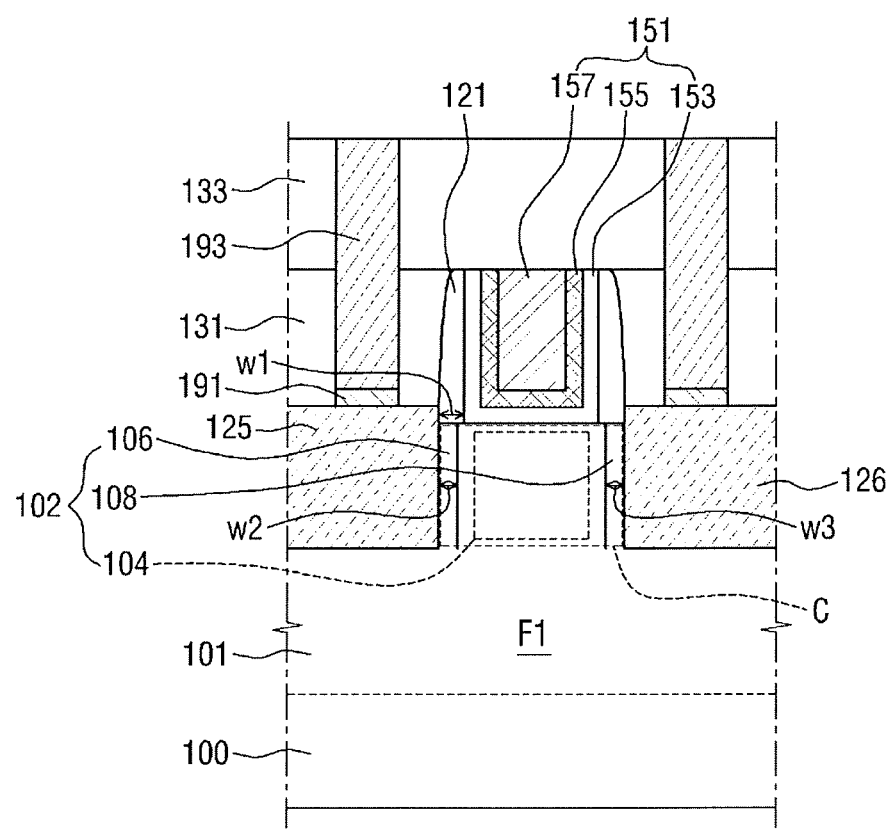

FIGS. 9 and 10 are diagrams of a semiconductor device 4 according to an exemplary embodiment of the present inventive concept. FIG. 9 is a perspective view of the semiconductor device 4 according to an exemplary embodiment of the present inventive concept, and FIG. 10 is a cross-sectional view taken along line A-A of FIG. 9. First and second interlayer insulation films 131 and 133 are not shown in FIG. 9 for the convenience of description.

The semiconductor device 4 of FIG. 9 further includes a third fin area 108, compared to the semiconductor device 3 of FIG. 6. For example, upper region 102 includes a first fin area 104, a second fin area 106, and a third fin area 108. The first fin area 104 is positioned under the gate structure 151 and the second fin area 106 and the third fin area 108 are positioned at opposite sides of the first fin area 104. The second fin area 106 is in contact with the source region 125 and the third fin area 108 is in contact with the drain region 126. The third fin area 108 extends to be substantially perpendicular to the substrate 100, for example, in a third direction Z1.

The third fin area 108 may include a first material and a second material, and a concentration of the first material in the third fin area 108 may be substantially equal to a second concentration of the first material in the second fin area 106. Therefore, a concentration of the first material in the third fin area 108 may be smaller than a concentration of the first material in the drain region 126 and may be greater than a concentration of the first material in the first fin area 104.

Next, a semiconductor device 4 according to an exemplary embodiment of the present inventive concept will be described with reference to FIGS. 11 and 12.

Figure 11:
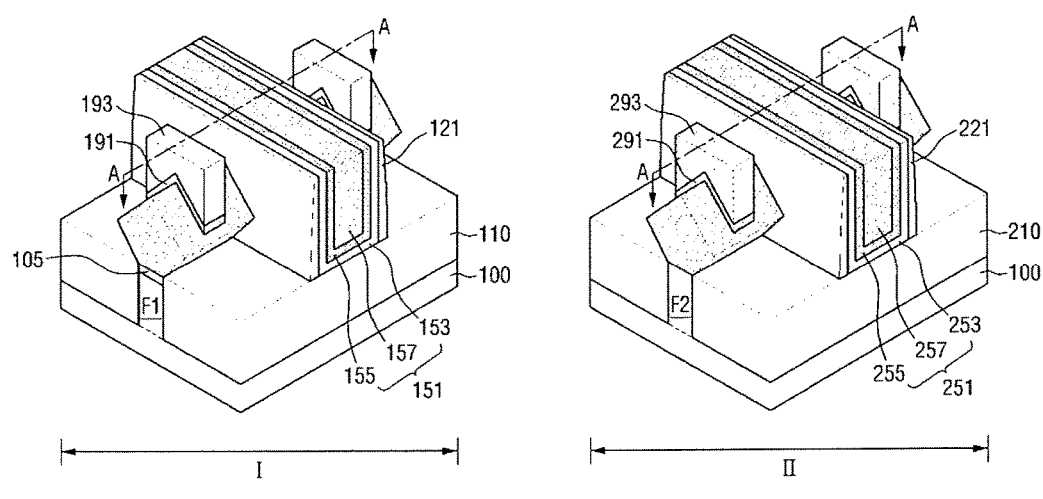
FIGS. 11 and 12 are diagrams of a semiconductor device according to an exemplary embodiment of the present inventive concept.
Figure 12:
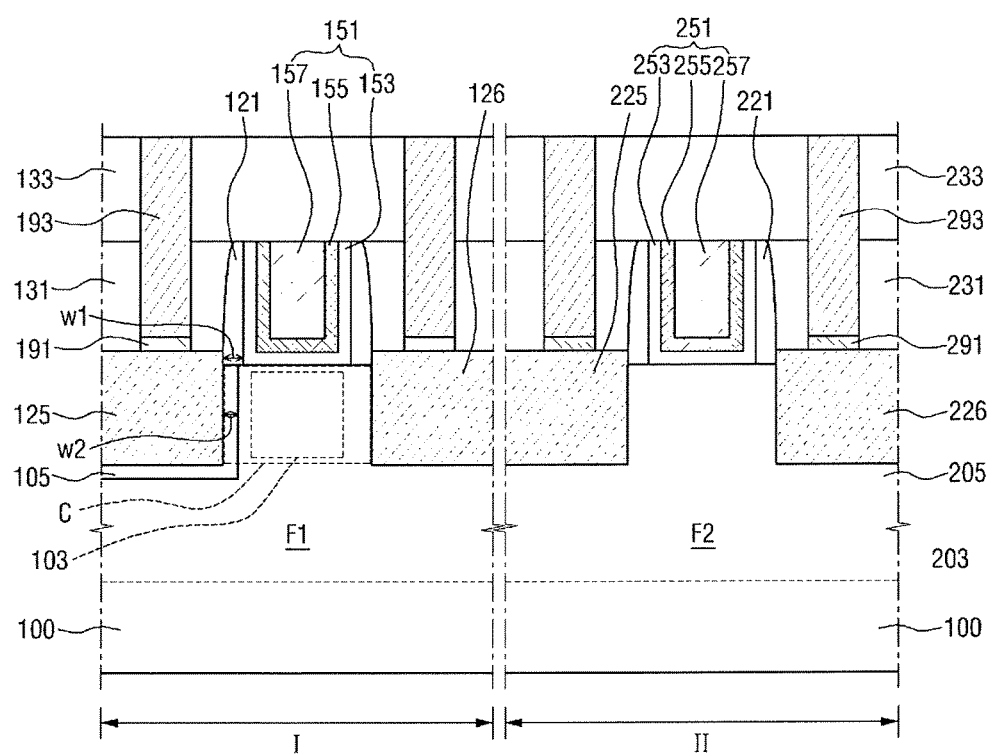

FIGS. 11 and 12 are diagrams of a semiconductor device 5 according to an exemplary embodiment of the present inventive concept. FIG. 11 is a perspective view of the semiconductor device 5 according to an exemplary embodiment of the present inventive concept, and FIG. 12 is a cross-sectional view taken along line A-A of FIG. 11. First and second interlayer insulation films 131, 231, 133 and 233 are not shown in FIG. 11 for the convenience of description.

In the semiconductor device 5 of FIG. 11, a substrate 100 includes a first region I and a second region II. The first region I and the second region II may be connected to each other or may be spaced apart from each other.

For example, the first region I may be a P-type Metal Oxide Semiconductor (PMOS) region and the second region II may be an N-type Metal Oxide Semiconductor (NMOS) region.

Since the first region I is the same as described above with reference to FIGS. 1 to 3, no further explanation will be given.

Referring to FIGS. 11 and 12, the second region II includes a fin F2, a field insulation layer 210, a gate structure 251, a spacer 221, a source region 225, a drain region 226, a silicide layer 291, a contact 293, a first interlayer insulation film 231 and a second interlayer insulation film 233.

The fin F2 extends on the substrate 100 in a lengthwise direction, that is, in a second direction Y1. The fin F2 includes long sides and short sides. In FIG. 11, the long side direction is a second direction Y1 and the short side direction is a first direction X1, but aspects of the present inventive concept are not limited thereto. For example, the fin F2 may have the first direction X1 as the long side direction and the second direction Y1 as the short side direction. The fin F2 protrudes from the substrate 200 in a third direction Z1.

The fin F2 may be a portion of the substrate 200 and may include an epitaxial layer grown from the substrate 200. The fin F2 may include a first material and a second material. The first material may have a larger lattice constant than the second material. For example, the first material may be Ge and the second material may be Si.

The fin F2 need not include the first material.

The fin F2 includes a channel region C positioned between the source region 225 and the drain region 226 and positioned under the gate structure 251.

The substrate 100 may include the second material. For example, the substrate 100 may include a semiconductor material including Si or SiC. Alternatively, the substrate 200 may be a silicon on insulator (SOI) substrate. In addition, the substrate 200 may include the first material and the second material. For example, the substrate 200 may include a semiconductor material including SiGe or SiGeC.

The field insulation layer 210 is formed on the substrate 100, covering portions of sidewalls of the fin F2 while exposing a top portion of the fin F2.

The gate structure 251 is disposed on the fin F2, crossing the fin F2. For example, the gate structure 251 crosses the channel region C. In FIG. 11, the gate structure 251 extending in a first direction X1 is illustrated, but aspects of the present inventive concept are not limited thereto. The gate structure 251 may cross the fin F2 while forming an acute angle or an obtuse angle with respect to the fin F2.

The gate structure 251 includes gate electrodes 255 and 257 and a gate insulation layer 253.

The gate electrodes 255 and 257 may include a first metal layer 255 and a second metal layer 257. As shown, the gate electrodes 255 and 257 may have a stacked structure having two or more metal layers 255 and 257 stacked one on the other. The first metal layer 255 may adjust a work function. The second metal layer 257 fills a space formed by the first metal layer 255. For example, the first metal layer 255 may include at least one of TiAl, TiAlC, TiAlN, HfSi, TiN, TaN, TiC, and TaC. In addition, the second metal layer 257 may include W or Al. Alternatively, the gate electrodes 255 and 257 may include a non-metal material, such as Si or SiGe. The gate structure 251 may be formed by, for example, a replacement process, but aspects of the present inventive concept are not limited thereto.

The gate insulation layer 253 is formed between the fin F2 and each of the gate electrodes 255 and 257. The gate insulation layer 253 is formed on a top surface and top portions of sidewalls of the fin F2. In addition, the gate insulation layer 253 is positioned between each of the gate electrodes 255 and 257 and the field insulation layer 210. The gate insulation layer 253 may have a high-k material having a higher dielectric constant than silicon oxide. The gate insulation layer 253 may include, for example, $HfO_2$, $ZrO_2$, LaO, $Al_2O_3$ or $Ta_2O_5$.

The spacer 221 is formed on the sidewalls of the gate structure 251. The spacer 221 may include at least one of a nitride layer and an oxynitride layer. The spacer 221 may include multiple layers.

The source region 225 and the drain region 226 are disposed at opposite sides of the gate structure 251. For example, the source region 225 is in contact with the second fin area 205 at one side of the gate structure 251, and the drain region 226 is disposed at the other side of the channel region C.

The source region 225 is an elevated source region, and the drain region 226 is an elevated drain region. Therefore, as shown in FIG. 12, top surfaces of the source region 225 and the drain region 226 are higher than a top surface of the fin F2.

The source region 225 and the drain region 226 may include the same material with the substrate 200 or an material which may apply tensile stress to a channel region. For example, the source region 225 and the drain region 226 may include the second material. Alternatively, the source region 225 and the drain region 226 may further include a material having a smaller lattice constant than a material of the fin F2. For example, the source region 225 and the drain region 226 may further include a material, such as C or P.

A silicide layer 291 is disposed on the source region 225 and the drain region 226. The silicide layer 291 may reduce contact resistance between the source region 225 and the contact 293 and between the drain region 226 and the contact 293. The silicide layer 291 may include, for example, Pt, Ni, Co, Au, or Al.

The contact 293 is formed on the silicide layer 291. The contact 293 penetrates through the first and second interlayer insulation films 231 and 233 to be in contact with the silicide layer 291. The contact 293 may include a conductive material, such as W, Al or Cu.

The contact 293 has a constant width from its bottom portion to its top portion, but aspects of the present inventive concept are not limited thereto. For example, the contact 293 may have upwardly increasing widths.

The first interlayer insulation film 231 and the second interlayer insulation film 233 are sequentially formed on the field insulation layer 210. The first interlayer insulation film 131 covers the silicide layer 291 and portions of sidewalls of the contact 293. The second interlayer insulation film 233 covers the remaining portions of the sidewalls of the contact 293.

As shown in FIG. 12, a top surface of the first interlayer insulation film 231 is coplanar with the top surface of the gate structure 251. Such planarization may be performed using a CMP process or an etch-back process. The second interlayer insulation film 232 covers the gate structure 151. The first interlayer insulation film 231 and the second interlayer insulation film 232 may include at least one of an oxide layer, a nitride layer and an oxynitride layer.

Next, a semiconductor device 6 according to an exemplary embodiment of the present inventive concept will be described with reference to FIGS. 13 and 14.

Figure 13:
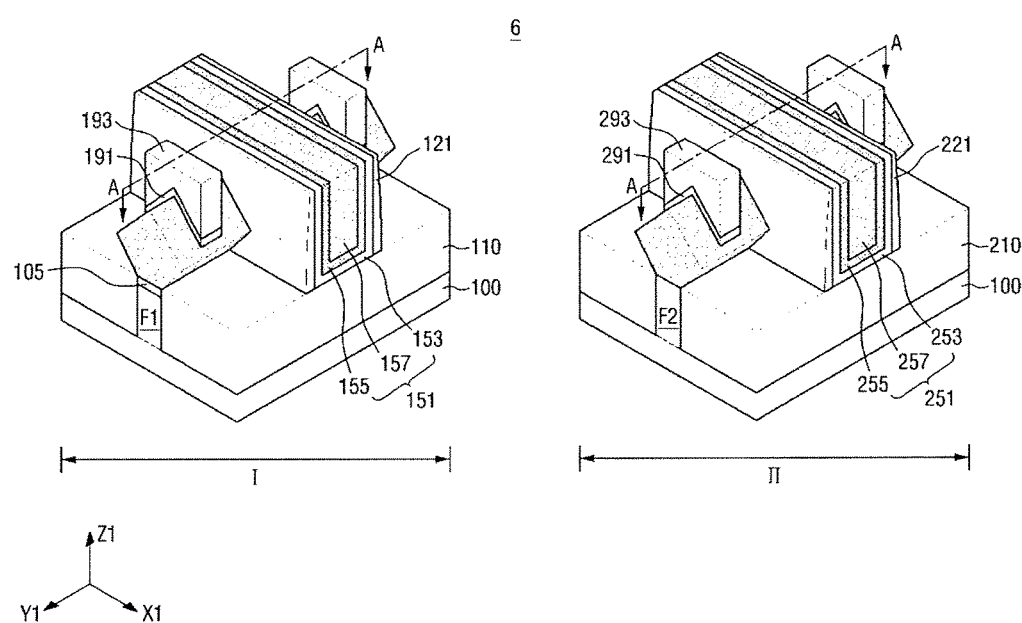
FIGS. 13 and 14 are diagrams of a semiconductor device according to an exemplary embodiment of the present inventive concept.
Figure 14:
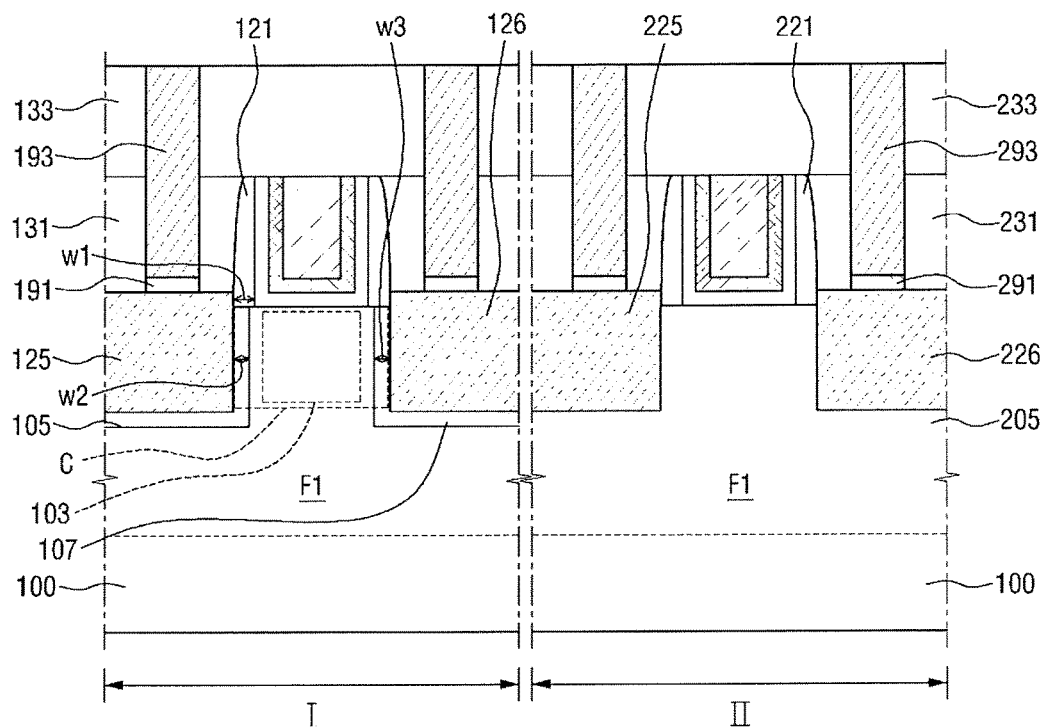

FIGS. 13 and 14 are diagrams of a semiconductor device 6 according to an exemplary embodiment of the present inventive concept. FIG. 13 is a perspective view of the semiconductor device 6 according to an exemplary embodiment of the present inventive concept, and FIG. 14 is a cross-sectional view taken along line A-A of FIG. 13. First and second interlayer insulation films 131, 231, 133 and 233 are not shown in FIG. 13 for the convenience of description.

Like the semiconductor device 5 of FIG. 11, the semiconductor device 6 of FIG. 13 includes a first region I and a second region II. For example, the first region I may be a PMOS region and the second region II may be an NMOS region.

The first region I of the semiconductor device 6 as shown in FIG. 13 may have the same configuration with the first region I of the semiconductor device 2 as shown in FIG. 4 and the second region II of the semiconductor device 6 as shown in FIG. 13 may have the same configuration with the second region II of the semiconductor device 11.

Next, a semiconductor device according to an embodiment of the present inventive concept will be described with reference to FIGS. 1 to 3 and 13 to 28. The same content as described above will be omitted and the following description will focus on differences.

Figure 17:
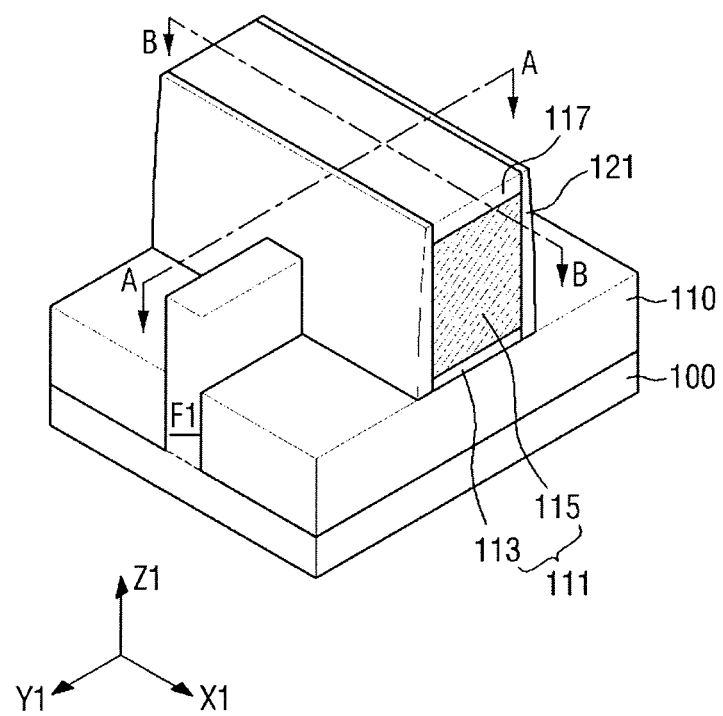
Figure 18:
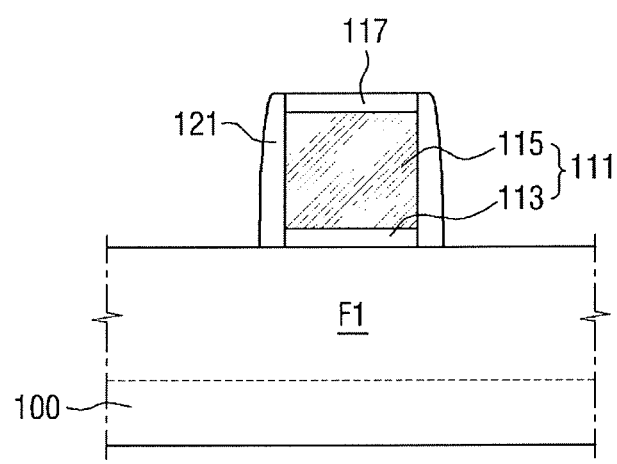
Figure 19:
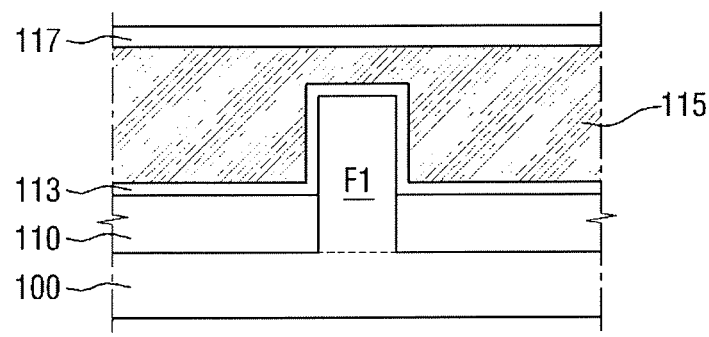
Figure 29:
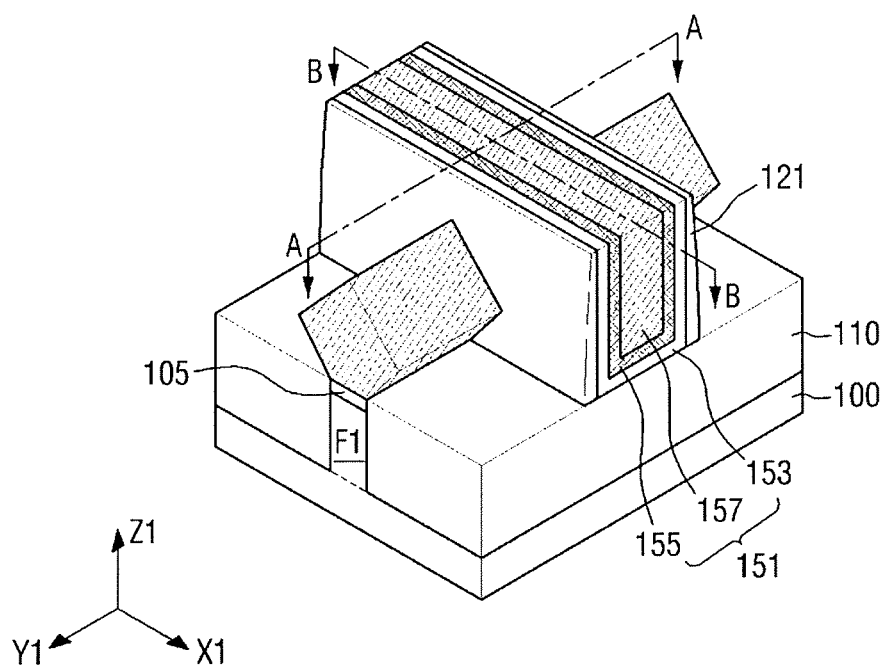
Figure 30:
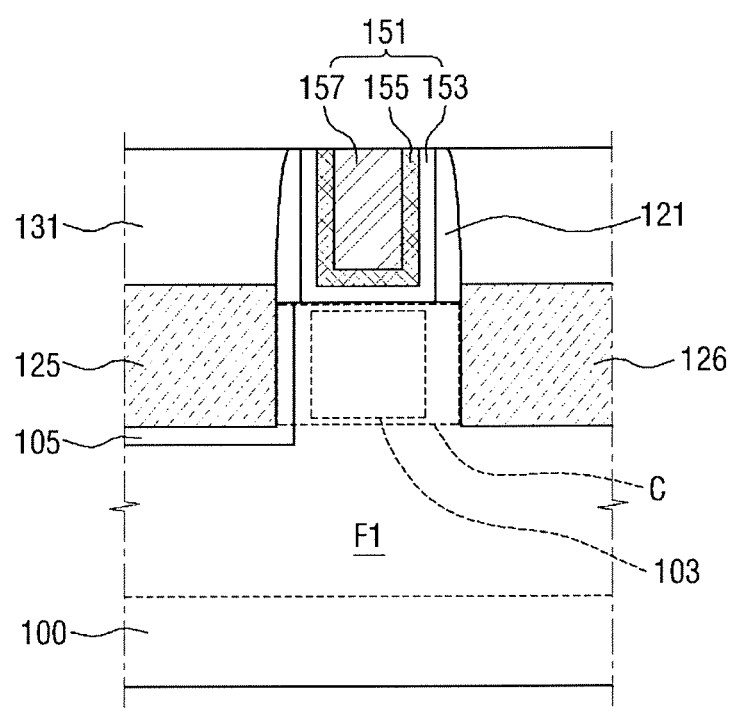
Figure 31:
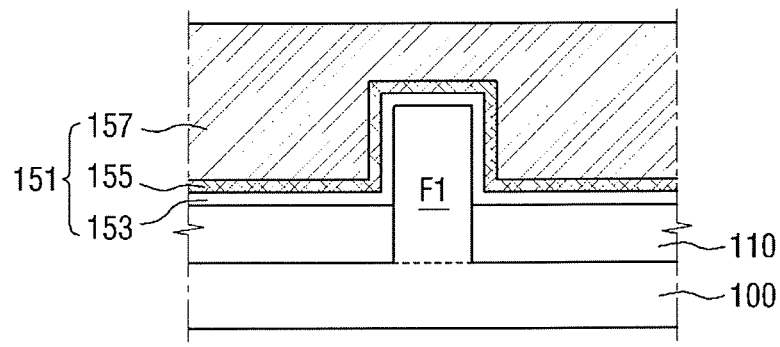

FIGS. 15 to 31 illustrate process steps of a method for fabricating a semiconductor device according to an embodiment of the present inventive concept. FIGS. 15, 16, 17, 20, 21, 22, 24 and 29 are perspective views of the semiconductor device according to an exemplary embodiment of the present inventive concept, FIG. 18 is a cross-sectional view taken along line A-A of FIG. 17, FIG. 19 is a cross-sectional view taken along line B-B of FIG. 17, FIG. 23 is a cross-sectional view taken along line A-A of FIG. 22, FIGS. 25 to 28 are cross-sectional views taken along line A-A of FIG. 24, FIG. 30 is a cross-sectional view taken along line A-A of FIG. 29, and FIG. 31 is a cross-sectional view taken along line B-B of FIG. 29.

Figure 15:
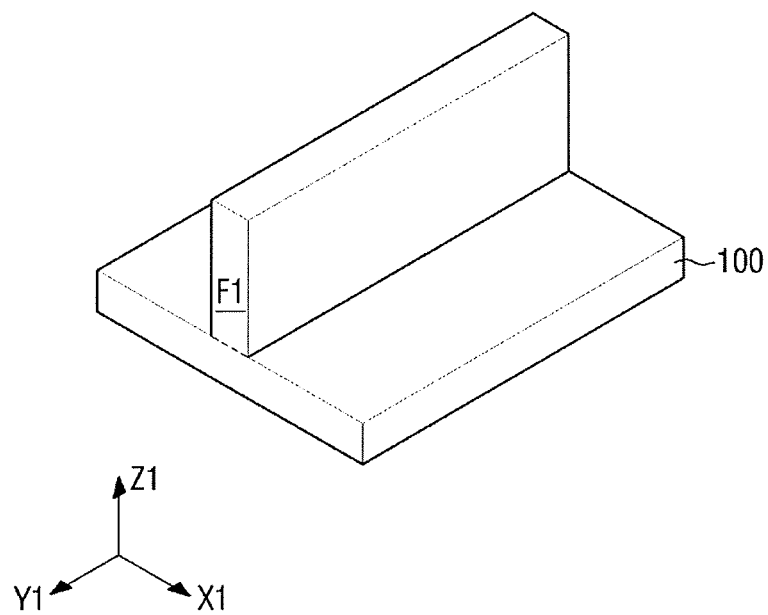
FIGS. 15 to 31 illustrate process steps of a method for fabricating a semiconductor device according to an embodiment of the present inventive concept.

First, referring to FIG. 15, a fin F1 is formed on a substrate 100. The fin F1 protrudes from the substrate 100 in a third direction Z1. The fin F1 extends lengthwise in a second direction Y1, having long sides of the second direction Y1 and short sides of the first direction X1. However, aspects of the present inventive concept are not limited thereto. For example, the long side direction may be the first direction X1 and the short side direction may be the second direction Y2.

The fin F1 may be a portion of the substrate 100. Alternatively, the fin F1 may be an epitaxial layer grown from the substrate 100. The fin F1 may include a first material and a second material. The first material may have a larger lattice constant than the second material. For example, the first material may be Ge and the second material may be Si.

The substrate 100 may include the first material and the second material or may include the second material only.

Figure 16:
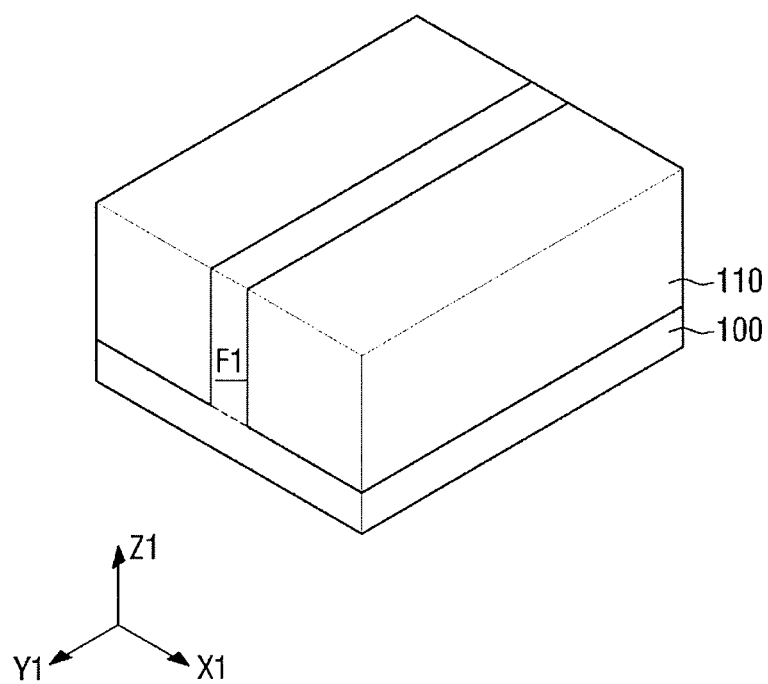

Referring to FIG. 16, a field insulation layer 110 is formed to cover on the substrate 100 to cover sidewalls of the fin F1. The field insulation layer 110 may include at least one of a silicon oxide layer, a silicon nitride layer, and a silicon oxynitride layer.

Referring to FIG. 17, a top portion of the field insulation layer 110 is recessed to expose a top portion of the fin F1. The recessing may be performed using a selective etching process, for example.

Alternatively, a portion of the fin F1 protruding above the field insulation layer 110 may be formed without using the selective etching process. For example, after the forming of the field insulation layer 110, an epitaxial process may be performed using the top surface of the fin F1 exposed by the field insulation layer 110 as a seed without recessing, thereby forming the portion of the fin F1.

Next, a dummy gate structure 111 crossing the fin F1 is formed on the fin F1. The dummy gate structure 111 crossing the fin F1 at right angle, that is, in the first direction X1, is illustrated in FIG. 17, but aspects of the present inventive concept are not limited thereto. The dummy gate structure 111 crosses the fin F1 at an acute angle and/or an obtuse angle with respect to the first direction X1. An intersection of the dummy gate structure 111 and the fin F1 corresponds to the channel region C of FIG. 23.

The dummy gate structure 111 includes a dummy gate insulation layer 113 and a dummy gate electrode 115. As shown in FIGS. 18 and 19, the dummy gate insulation layer 113 and the dummy gate electrode 115 are sequentially stacked.

The dummy gate insulation layer 113 is conformally formed along top portions of the sidewalls and top surface of the exposed fin F1 which is not covered by the field insulation layer 110. In addition, the dummy gate insulation layer 113 is positioned between the dummy gate electrode 115 and the field insulation layer 110.

The dummy gate electrode 115 is formed on the dummy gate insulation layer 113.

For example, the dummy gate electrode 115 may include polysilicon, and the dummy gate insulation layer 113 may include silicon oxide.

A dummy hard mask layer 117 is formed on the dummy gate structure 111. The dummy hard mask layer 117 may include at least one of silicon oxide, silicon nitride, and silicon oxynitride.

Next, the spacer 121 is formed on both sidewalls of the dummy gate structures 111. The spacer 121 exposes a top surface of the dummy hard mask layer 117. The spacer 121 may include silicon nitride or silicon oxynitride.

Figure 20:
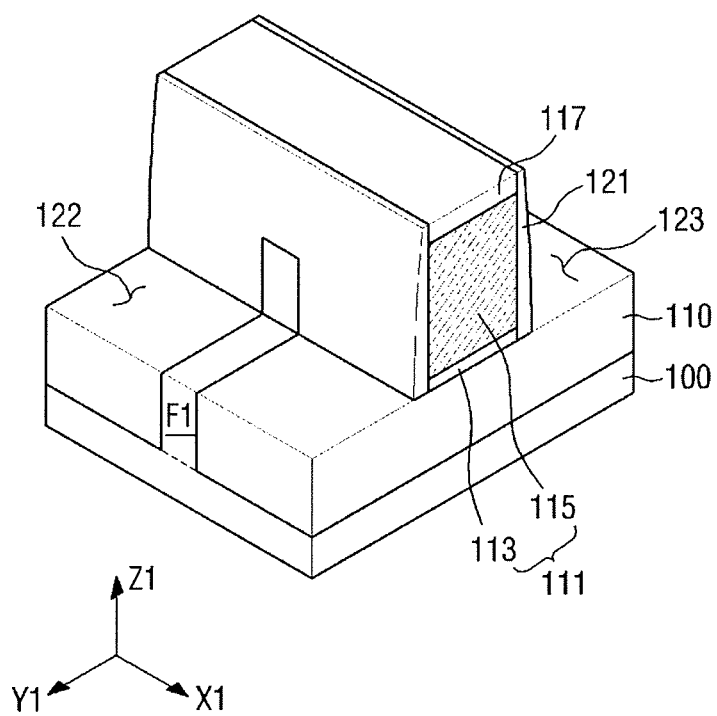

Referring to FIG. 20, the exposed fin F1 that is not covered by the dummy gate structure 111 is etched. The fin F1 is etched using the spacer 121 and the dummy gate structure 111 as etch masks. The first recess 122 and the second recess 123 are formed by etching the fin F1. Sidewalls of the channel region (C of FIG. 23) and bottom surfaces of the first recess 122 and the second recess 123 are exposed to the outside by the first recess 122 and the second recess 123.

Figure 21:
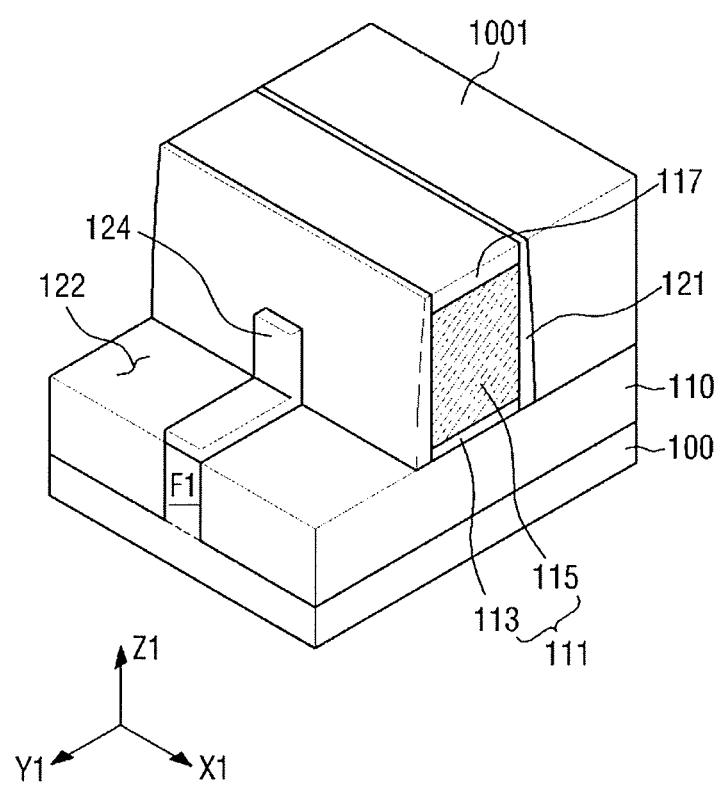

Referring to FIG. 21, the second recess 123 is covered by a mask 1001. In FIG. 21, the mask 1001 covering the second recess 123 and the sidewalls of the spacer 121 in the second recess 123 is illustrated, but aspects of the present inventive concept are not limited thereto. For example, the mask 1001 also covers a portion of the dummy hard mask layer 117.

Next, an oxide layer 124 is formed by oxidizing a surface of the fin F1 exposed by the first recess 121. The surface of the fin F1 may be oxidized at about 700° C. to about 800° C. Here, the second material may be more reactive with oxygen on the surface of the fin F1 than the first material. In the oxide layer 124, a concentration of the first material may be smaller than a concentration of the second material.

Figure 22:
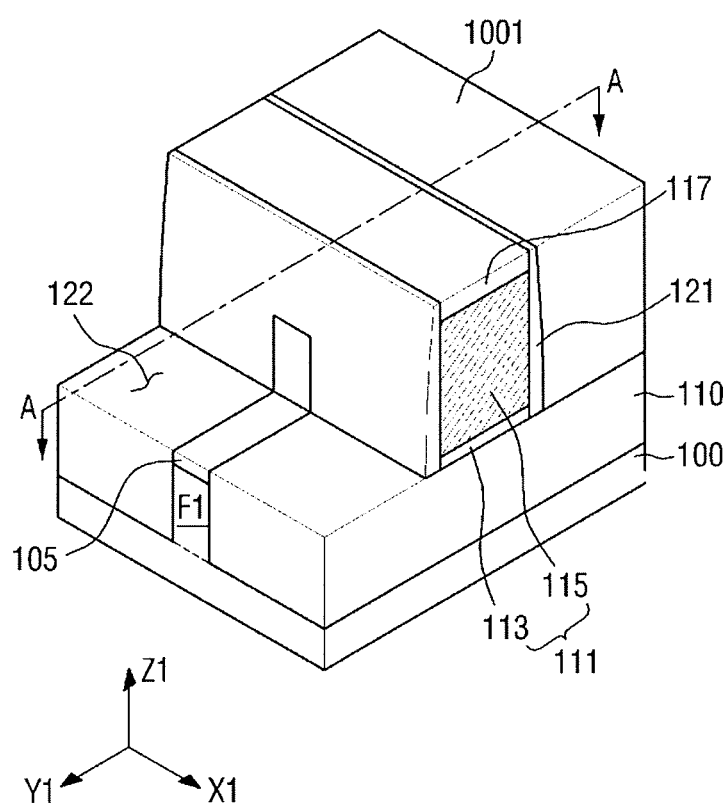
Figure 23:
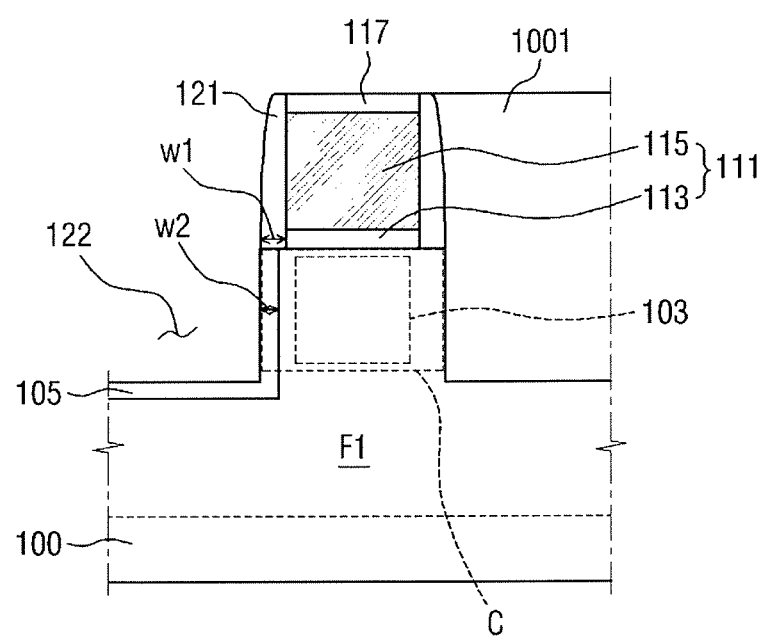
Figure 24:
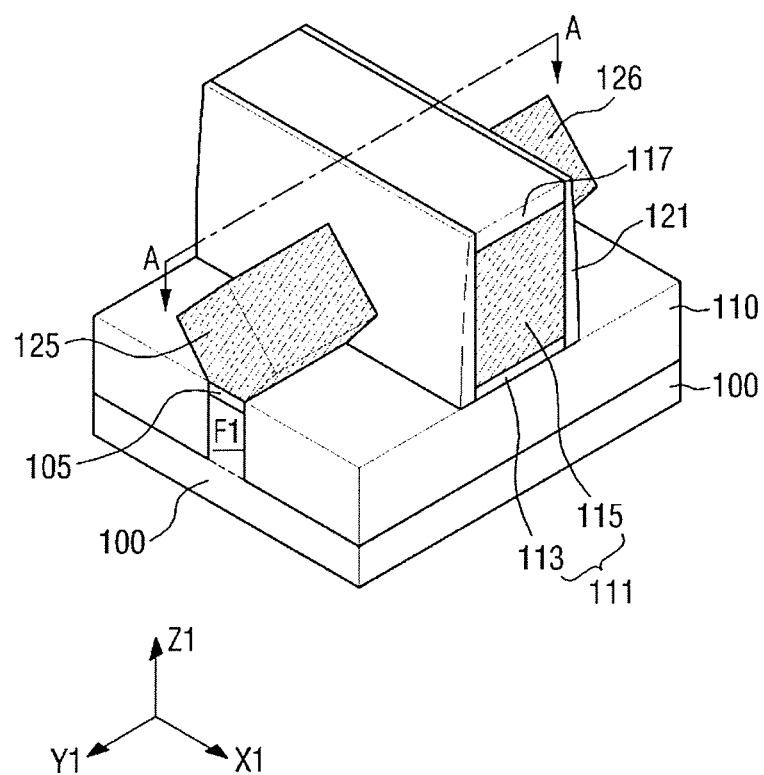

Referring to FIGS. 22 and 23, the oxide layer 124 is removed. The fin F1 includes a first fin area 103 and a second fin area 105 by the oxide layer 124.

The second fin area 105 may be a portion of the oxidized fin F1 and the first fin area 103 may be a portion of the non-oxidized fin F1. The second fin area 105 is formed in the fin F1, and is positioned along the surface of the first recess 122. Therefore, the second fin area 105 may be formed along the sidewalls of the channel region C and a bottom surface of the first recess 122. The second fin area 105 constitutes one sidewall of the channel region C. The first fin area 103 is positioned in the channel region C.

A width W2 of the second fin area 105 is smaller than a width W1 of the portion of the spacer 121 being in contact with the second fin area 105.

Since the second material is more oxidized than the first material in the second fin area 105, the concentration of the first material is higher in the second fin area 105 than in the first fin area 103. Therefore, the second concentration of the first material in the second fin area 105 may be higher than the first concentration of the first material in the first fin area 103. In addition, since the second material is more oxidized in the exposed surface of the fin F1 in the second fin area 105 than in other portions, the concentration of the first material in the second fin area 105 may gradually decrease from the exposed surface of the second fin area 105 to the first fin area 103.

Since the second material is not oxidized in the first fin area 103, the concentration of the first material and the concentration of the second material may be uniform throughout the first fin area 103.

The concentration of the second material in the second fin area 105 may be smaller than the concentration of the second material in the first fin area 103.

Figure 25:
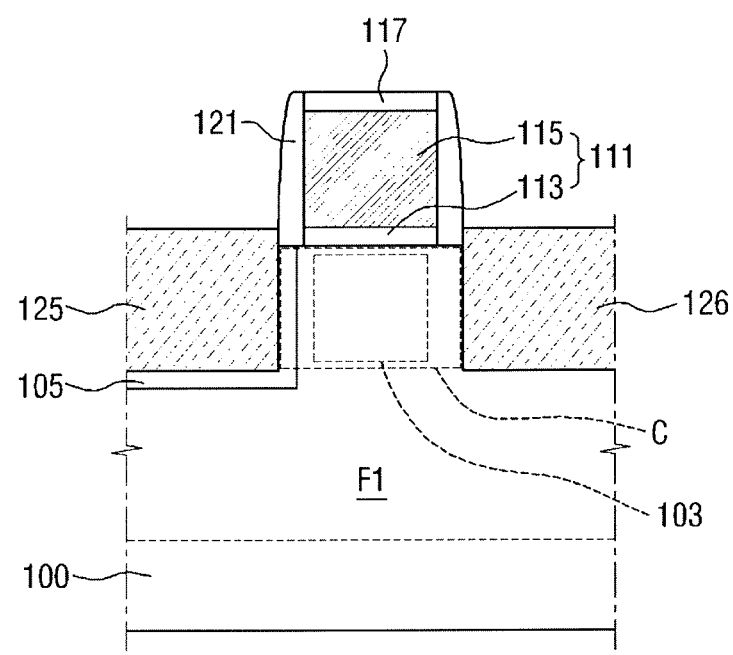

Referring to FIGS. 24 and 25, the mask 1001 is removed. Then, the first recess 122 and the second recess 123 are exposed.

Next, a source region 125 is formed in the first recess 122 and a drain region 126 is formed in the second recess 123. The source region 125 and the drain region 126 may be simultaneously formed. The channel region C is positioned between the source region 125 and the drain region 126.

The source region 125 and the drain region 126 are elevated source/drain regions. Therefore, as shown in FIG. 25, top surfaces of the source region 125 and the drain region 126 are higher than the top surface of the fin F1.

The source region 125 is in contact with the second fin area 105.

The source region 125 and the drain region 126 may include a first material and a second material. A concentration of the first material in the source region 125 and a concentration of the first material in the drain region 126 may be greater than the second concentration of the first material in the second fin area 105. Since the source region 125 and the drain region 126 are simultaneously formed, the concentration of the first material in the source region 125 and the concentration of the first material in the drain region 126 may be substantially equal to each other.

The first material included in the source region 125 and the drain region 126 has a greater lattice constant than the second material. Therefore, the first material may increase mobility of carriers in the channel region C by applying compressive stress to the channel region C.

The source region 125 and the drain region 126 may be formed by epitaxial growth.

The source region 125 and the drain region 126 having a pentagonal shape are illustrated in FIG. 24, but aspects of the present inventive concept are not limited thereto. For example, the source region 125 and the drain region 126 may have rectangular, circular or hexagonal shapes.

Figure 26:
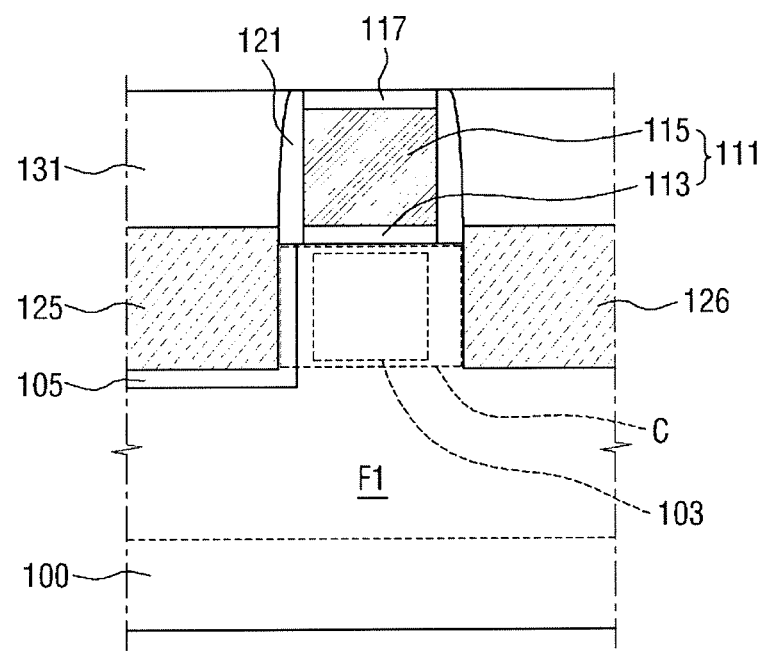

Referring to FIG. 26, a first interlayer insulation film 131 covering the source region 125 and the drain region 126 is formed. The first interlayer insulation film 131 covers the sidewalls of the spacer 121 while exposing a top surface of the dummy hard mask layer 117. The first interlayer insulation film 131 may include, for example, silicon oxide.

Figure 27:
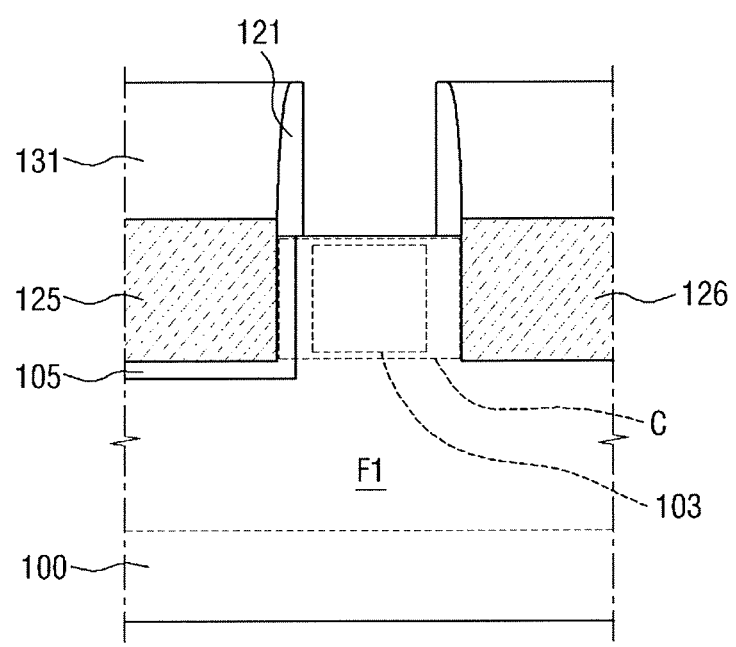

Referring to FIG. 27, the dummy hard mask layer 117 and the dummy gate structure 111 are removed. The dummy hard mask layer 117 is removed by a planarization process, but aspects of the present inventive concept are not limited thereto.

Next, the fin F1 is exposed by removing the dummy gate electrode 115 and the dummy gate insulation layer 113. If the dummy gate electrode 115 and the dummy gate insulation layer 113 are removed, sidewalls of the spacers 121 and 221 are exposed, and the channel region C is also exposed.

Figure 28:
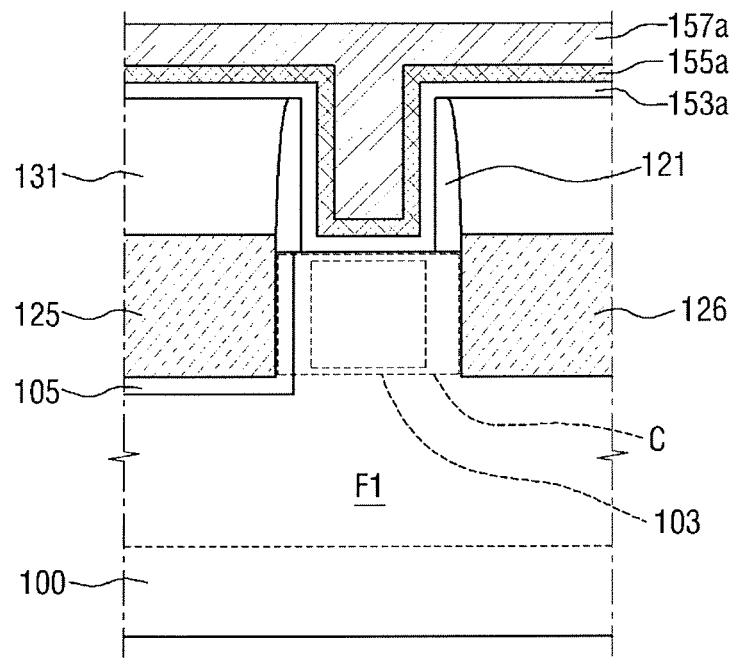

Referring to FIG. 28, the gate insulation layer 153a, and a first metal layer 155a and a second metal layer 157a constituting a gate electrode are sequentially formed.

The gate insulation layer 153a is conformally formed along the sidewalls of the spacer 121 and the top surface of the fin F1. The gate insulation layer 153a is also formed on the first interlayer insulation film 131.

The gate insulation layer 153a may include a high-k material having a higher dielectric constant than a silicon oxide layer. For example, the gate insulation layer 153a may include a material including HfSiON, $HfO_2$, $ZrO_2$, $Ta_2O_5$, $TiO_2$, $SrTiO_3$ or $(Ba,Sr)TiO_3$. The gate insulation layer 153a may be formed to appropriate thicknesses according to the kind of device to be formed.

The first metal layer 155a is formed on the gate insulation layer 153a. The first metal layer 155a is conformally formed along the sidewalls of the spacer 121 and the top surface of the fin F1. In addition, the first metal layer 155a is also formed on the first interlayer insulation film 131. The first metal layer 155a may control a work function of a transistor.

For example, if the first metal layer 155a is a P-type work function control film, it may include, for example, at least one nitride layer including TiN, TaN, TiAlN, TaAlN, or TiSiN. In the illustrated embodiment, the first metal layer 155a is a single layer, but aspects of the present inventive concept are not limited thereto. For example, the first metal layer 155a may include multiple layers having a P-type work function control film and an N-type work function control film stacked thereon.

The second metal layer 157a is formed on the first metal layer 155a. The second metal layer 157a may be formed in the inner space of the spacer 121 to the extent that a top surface of the second metal layer 157a is higher than a top surface of the first interlayer insulation film 131. The second metal layer 157a is also formed on the first interlayer insulation film 131.

The second metal layer 157a may include, for example, Al or W.

Referring to FIGS. 29 to 31, a gate structure 151 is formed. A planarization process is performed on the resulting structure of FIG. 28 to expose the first interlayer insulation film 131, thereby forming the gate structure 151 including the gate insulation layer 153, the first metal layer 155 and the second metal layer 157.

The gate structure 151 need not be in contact with the second fin area 105. The gate structure 151 is spaced apart from the second fin area 105.

In an exemplary embodiment, the gate insulation layer 153 and the first metal layer 155 may be recessed between the spacers 121.

Referring to FIG. 31, the gate insulation layer 153 is conformally formed along the field insulation layer 110 and top portions of the sidewalls and top surface of the fin F1. In addition, the first metal layer 155 is also conformally formed along the field insulation layer 110 and top portions of the sidewalls and top surface of the fin F1.

Referring back to FIGS. 1 to 3, the second interlayer insulation film 133 is formed on the first interlayer insulation film 131 to cover the gate structure 151.

The second interlayer insulation film 133 may include the same material as the first interlayer insulation film 131, for example, at least one of an oxide layer and an oxynitride layer.

Next, a contact hole is formed to expose the top surface of the source region 125 and the top surface of the drain region 126. The contact hole penetrates through the first and second interlayer insulation films 131 and 133. The silicide layer 191 is formed on the top surface of the source region 125 and the top surface of the drain region 126. The contact 193 filling the contact hole is formed on the silicide layer 191 to fabricate the semiconductor device 1 as shown in FIGS. 1 to 3.

The silicide layer 191 may reduce contact resistance of the source region 125 and the drain region 126, and may include, for example, Pt, Ni or Co. The contact 193 may include, for example, W, Al or Cu.

Next, a semiconductor device according to an exemplary embodiment of the present inventive concept will be described with reference to FIGS. 4, 5, 15 to 20 and 32 to 42. The same content as described above will be omitted and the following description will focus on differences.

Figure 32:
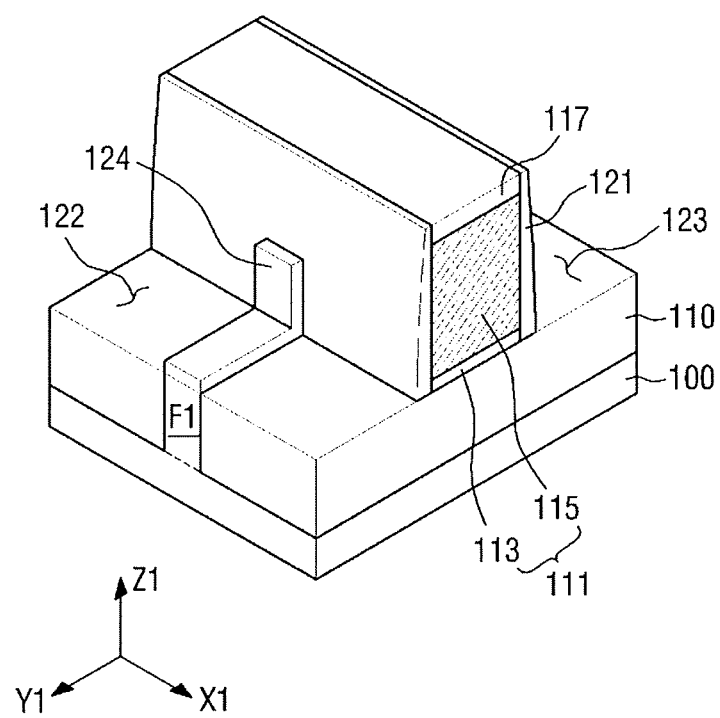
FIGS. 32 to 42 illustrate process steps of a method for fabricating a semiconductor device according to an exemplary embodiment of the present inventive concept.
Figure 33:
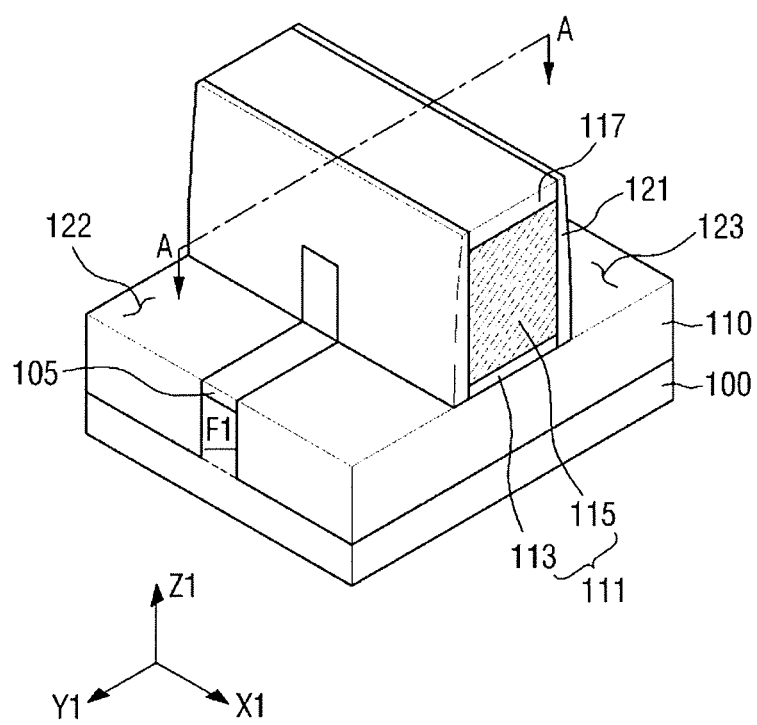
Figure 34:
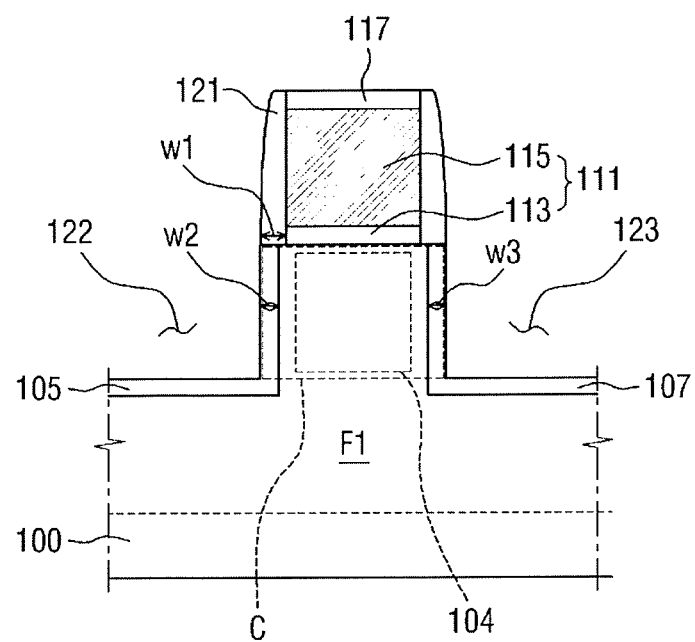
Figure 35:
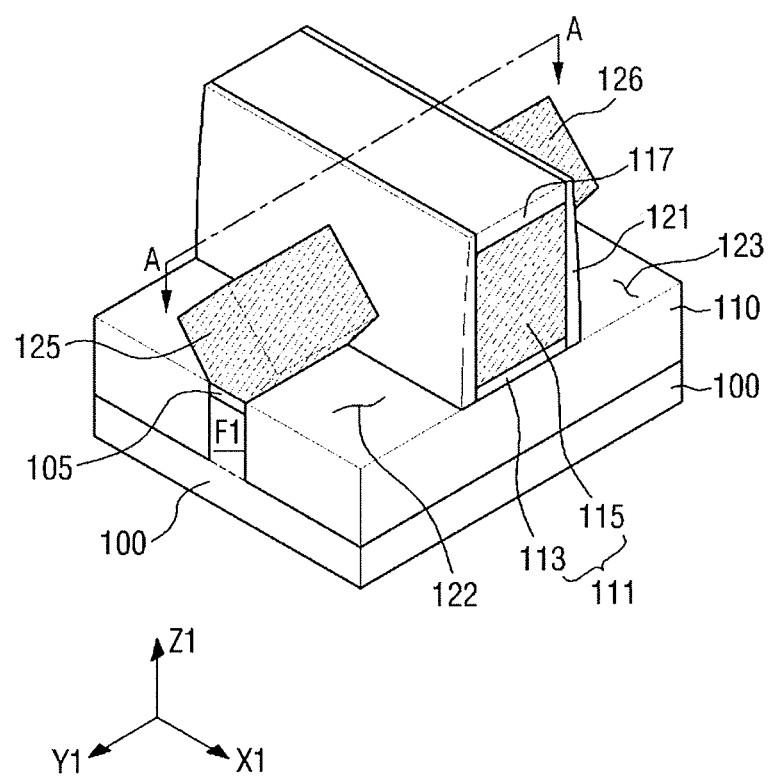
Figure 38:
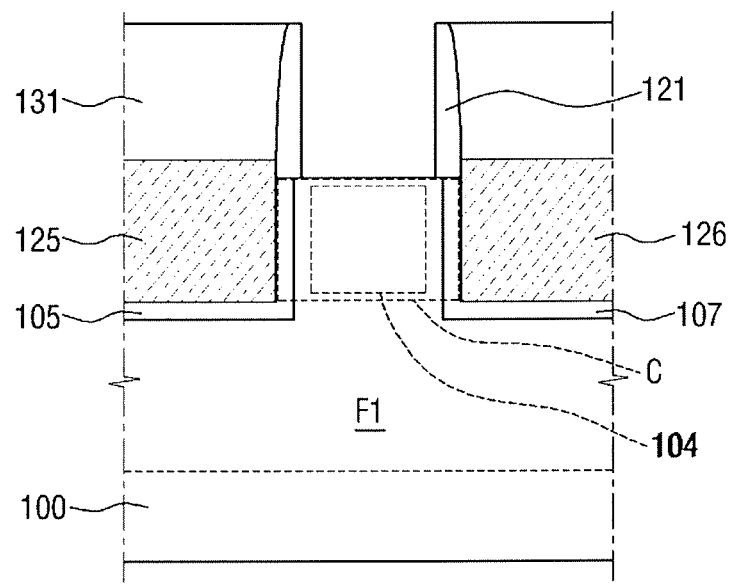
Figure 39:
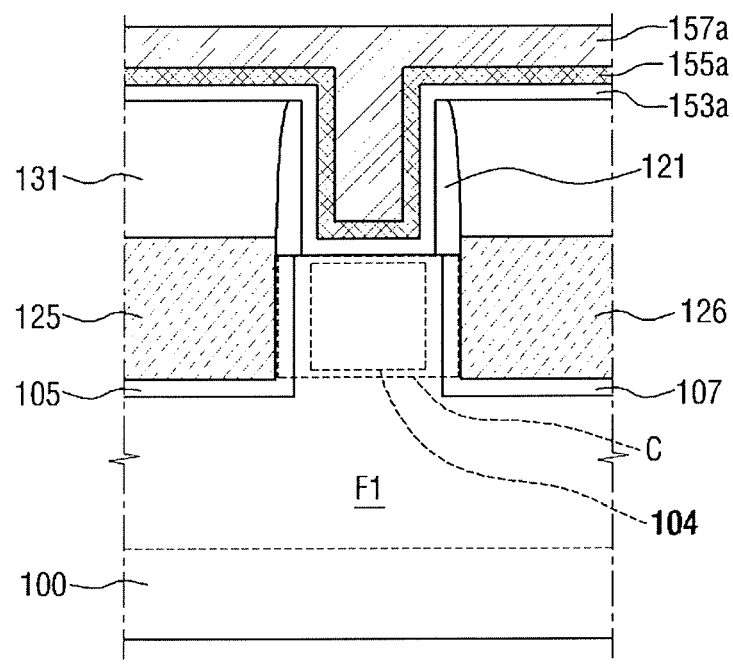
Figure 40:
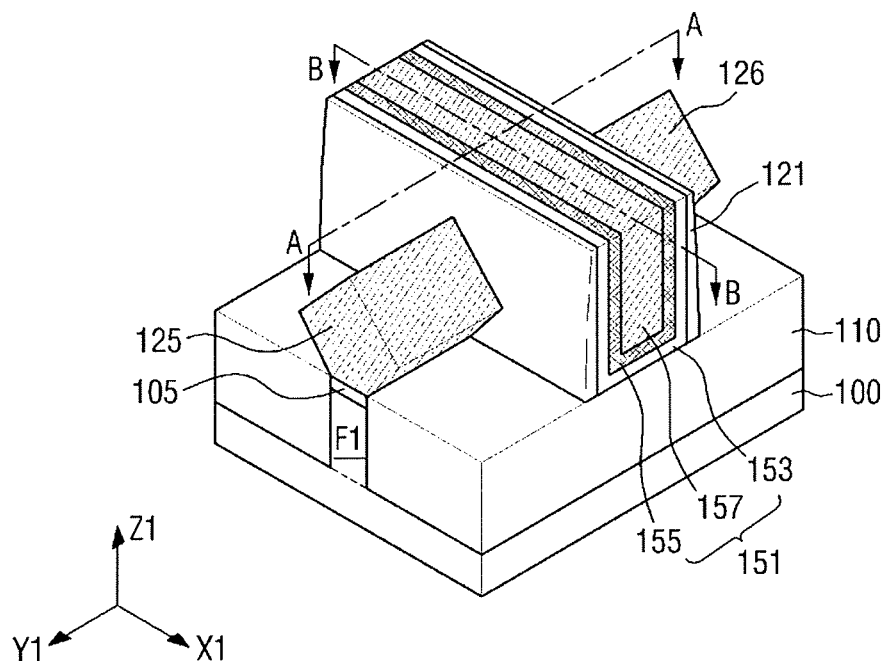
Figure 41:
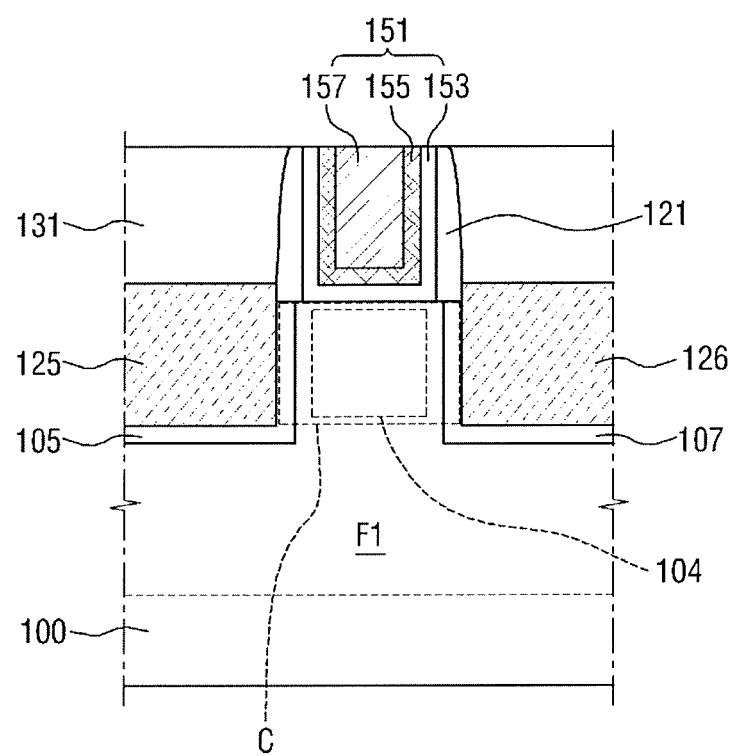
Figure 42:
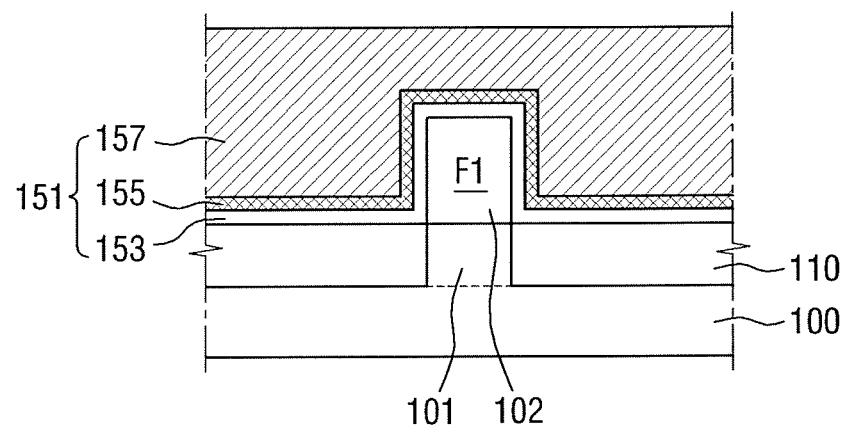

FIGS. 32 to 42 illustrate process steps of a method for fabricating a semiconductor device according to an exemplary embodiment of the present inventive concept. FIGS. 32, 33, 35 and 40 are perspective views of the semiconductor device according to an embodiment of the present inventive concept, FIG. 34 is a cross-sectional view taken along line A-A of FIG. 33, FIGS. 36 to 39 are cross-sectional views taken along line A-A of FIG. 35, FIG. 41 is a cross-sectional view taken along line A-A of FIG. 40, and FIG. 42 is a cross-sectional view taken along line B-B of FIG. 40.

Since descriptions of FIGS. 15 to 20 have already been made above, repeated descriptions thereof will be omitted.

Referring to FIG. 32, an oxide layer 124 is formed by oxidizing the first recess 122 and the surface of the fin F1 exposed by the second recess 123. Since the second recess 123 is not covered by the mask 1001, the oxide layer 124 is also formed on a surface of the second recess 123. The oxidizing may be performed at a temperature in a range of about 700° C. to about 800° C. The second material may be more reactive with oxygen than the first material to form the oxide layer 124.

Referring to FIGS. 33 and 34, the oxide layer 124 is removed to form the second fin area 105 and the third fin area 107 along the surface of the fin F1. The second fin area 105 is formed along the surface of the fin F1 exposed by the first recess 122. The third fin area 107 is formed along the surface of the fin F1 exposed by the second recess 123. The first fin area 104 is a portion of the fin F1 that is not oxidized.

The first fin area 104 is positioned between the second fin area 105 and the third fin area 107. The first fin area 104, a portion of the second fin area 105 and a portion of the third fin area 107 constitute the channel region C.

The second fin area 105 is formed on a bottom surface of the first recess 122 as well as sidewalls of the channel region C, and the third fin area 107 is formed on a bottom surface of the second recess 123 as well as sidewalls of the channel region C.

A width W2 of the second fin area 105 is smaller than a width W1 of a portion of the spacer 121 being in contact with the second fin area 105, and a width W3 of the third fin area 107 is smaller than a width W1 of a portion of the spacer 121 being in contact with the third fin area 107.

A second concentration of the first material in the second fin area 105 may be greater than the first concentration of the first material in the first fin area 103, and a third concentration of the first material in the third fin area 107 may be greater than the first concentration of the first material in the first fin area 103. Since the second fin area 105 and the third fin area 107 are simultaneously formed, the third concentration and the second concentration may be substantially equal to each other.

A concentration of the second material in the second fin area 105 may be smaller than a concentration of the second material in the first fin area 104. A concentration of the second material in the third fin area 107 may be smaller than a concentration of the second material in the first fin area 104.

The second material, less oxidized, may be more in the exposed surface of the fin F1 than the interior of the fin F1. The concentration of the first material may gradually decrease from the second fin area 105 to the exposed second fin area 105. The concentration of the first material may also gradually decrease from the second fin area 105 to the first fin area 103. Similarly, the concentration of the first material may gradually decrease from the third fin area 107 to the exposed third fin area 107. The concentration of the first material may also gradually decrease from the third fin area 107 to the first fin area 103.

Since the second material is not oxidized in the first fin area 104, the concentration of the first material may be uniform throughout the first fin area 104 and the concentration of the second material may also be uniform throughout the first fin area 104.

Figure 36:
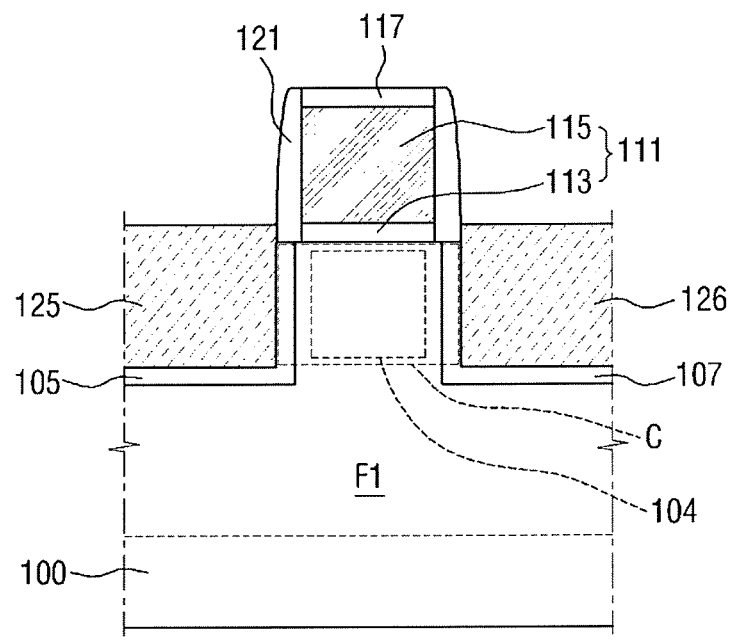

Referring to FIGS. 35 and 36, a source region 125 is formed in the first recess 122, and a drain region 126 is formed in the second recess 123. The source region 125 and the drain region 126 may be simultaneously formed. The channel region C is positioned between the source region 125 and the drain region 126.

The source region 125 and the drain region 126 are elevated source/drain regions. Therefore, as shown in FIG. 35, top surfaces of the source region 125 and the drain region 126 are higher than the top surface of the fin F1.

The source region 125 and the drain region 126 may include a first material and a second material. A concentration of the first material in the source region 125 and a concentration of the first material in the drain region 126 may be greater than the second concentration of the first material in the second fin area 105. Since the source region 125 and the drain region 126 are simultaneously formed, the concentration of the first material in the source region 125 and the concentration of the first material in the drain region 126 may be substantially equal to each other.

The first material may increase mobility of carriers in the channel region C by applying compressive stress to the channel region C.

The source region 125 and the drain region 126 may be formed by epitaxial growth.

Figure 37:
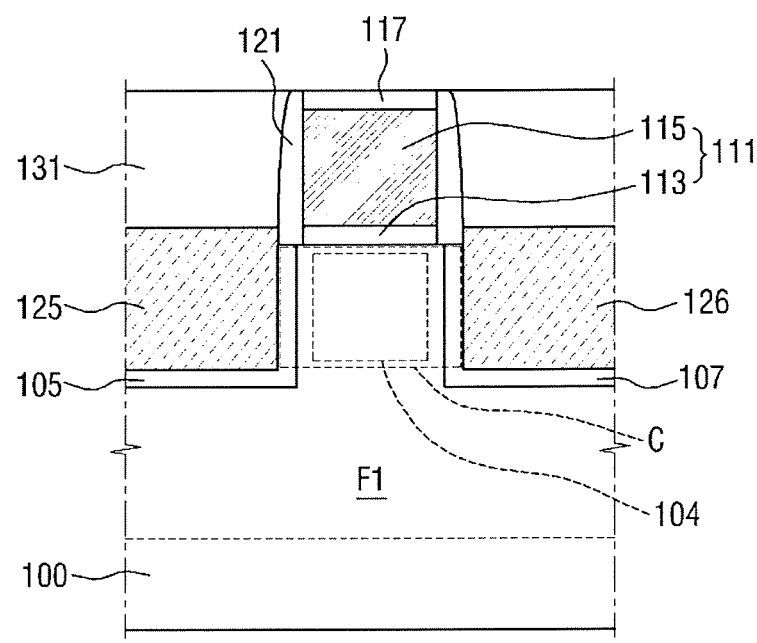

Referring to FIG. 37, a first interlayer insulation film 131 covering the source region 125 and the drain region 126 is formed. The first interlayer insulation film 131 may cover the sidewalls of the spacer 121 while exposing a top surface of a dummy hard mask layer 117. The first interlayer insulation film 131 may include, for example, silicon oxide.

Referring to FIG. 38, the dummy hard mask layer 117 and the dummy gate structure 111 are removed. The dummy hard mask layer 117 is removed by a planarization process, but aspects of the present inventive concept are not limited thereto.

Next, the fin F1 is exposed by removing the dummy gate electrode 115 and the dummy gate insulation layer 113. Sidewalls of the spacers 121 are exposed, and the channel region C is also exposed. [Please confirm the correction.]

Referring to FIG. 39, a gate insulation layer 153a, and a first metal layer 155a and a second metal layer 157a constituting a gate electrode, are sequentially formed.

Referring to FIGS. 40 to 42, a gate structure 151 is formed. A planarization process is performed on the resulting structure of FIG. 39 to expose the first interlayer insulation film 131, thereby forming the gate structure 151 including the gate insulation layer 153, the first metal layer 155 and the second metal layer 157.

The gate structure 151 need not be in contact with the second fin area 105, and is spaced apart from the second fin area 105.

Referring back to FIGS. 4 and 5, the second interlayer insulation film 133 is formed on the first interlayer insulation film 131 to cover the gate structure 151. A contact hole is formed to expose the top surface of the source region 125 and the top surface of the drain region 126. The contact hole penetrates through the first and second interlayer insulation films 131 and 133. The silicide layer 191 is formed on the top surface of the source region 125 and the top surface of the drain region 126. The contact 193 filling the contact hole is formed on the silicide layer 191 to fabricate the semiconductor device 2 as shown in FIGS. 4 and 5.

Next, a semiconductor device according to an exemplary embodiment of the present inventive concept will be described with reference to FIGS. 6 to 8 and 43 to 58. The same content as described above will be omitted and the following description will focus on differences.

Figure 45:
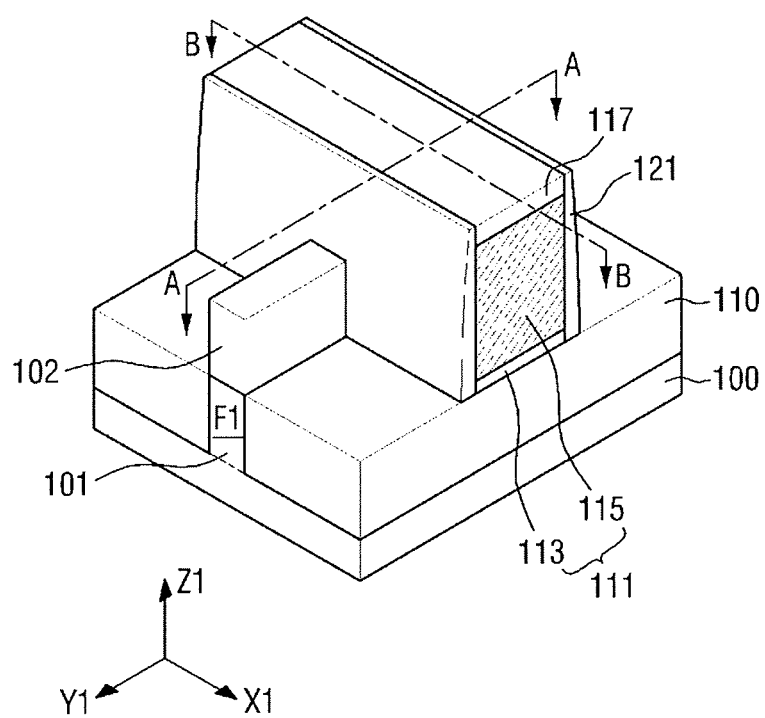
Figure 46:
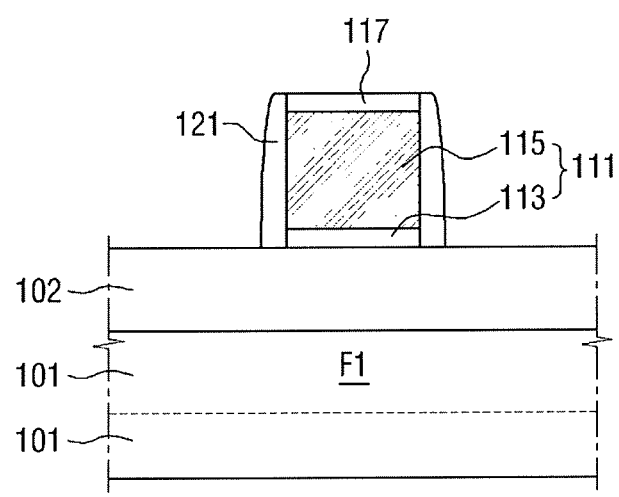
Figure 47:
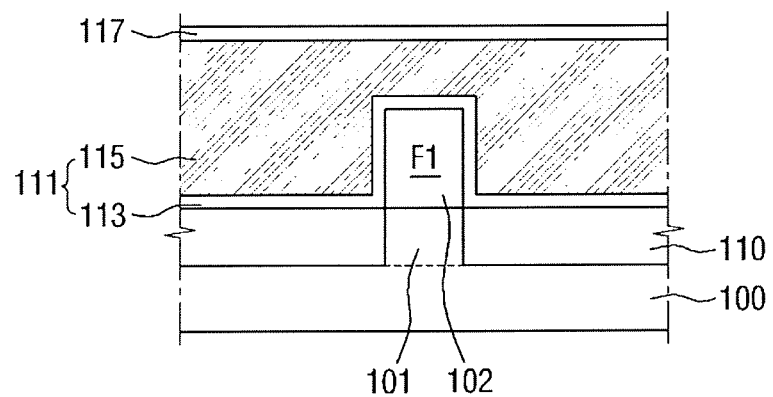
Figure 56:
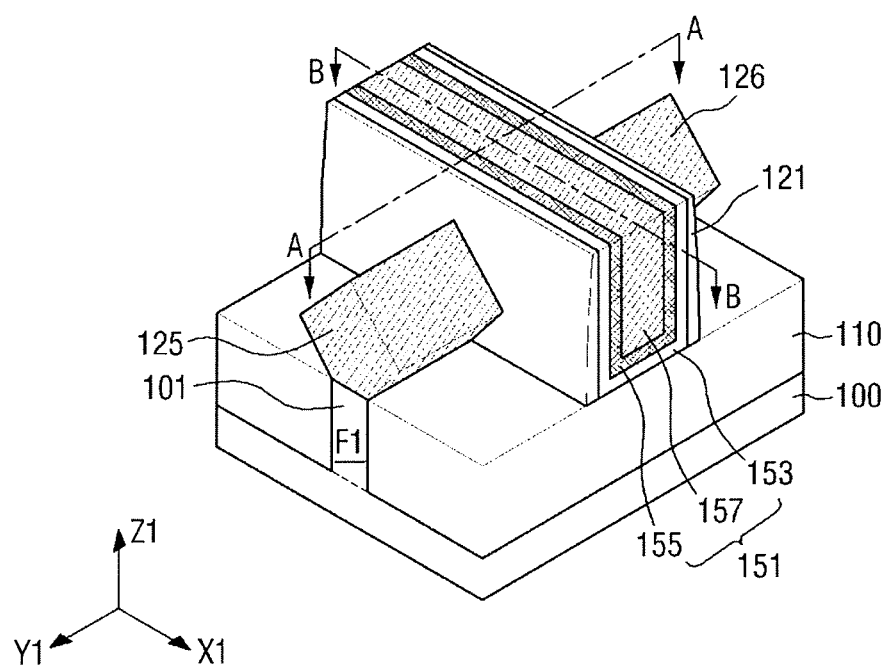
Figure 57:
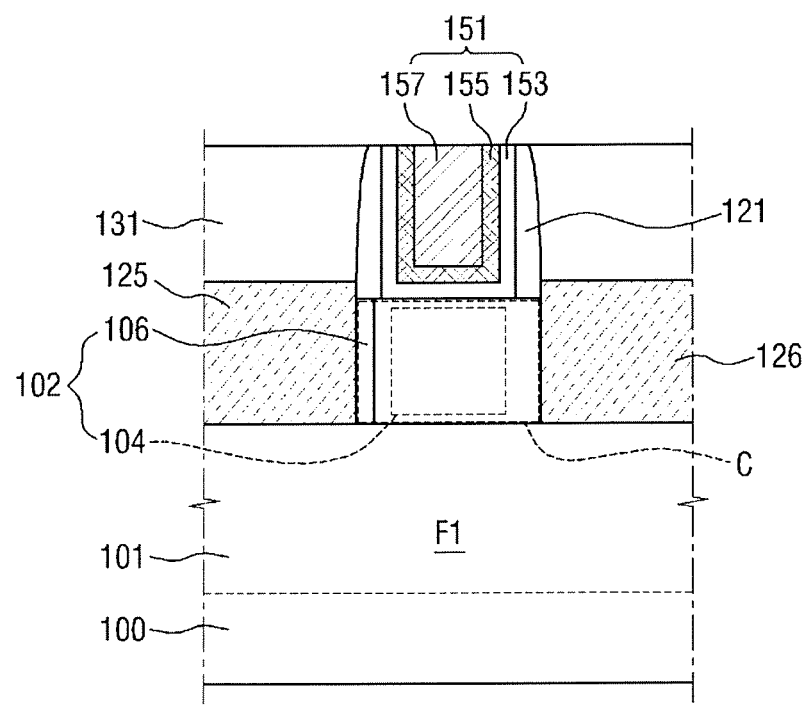
Figure 58:
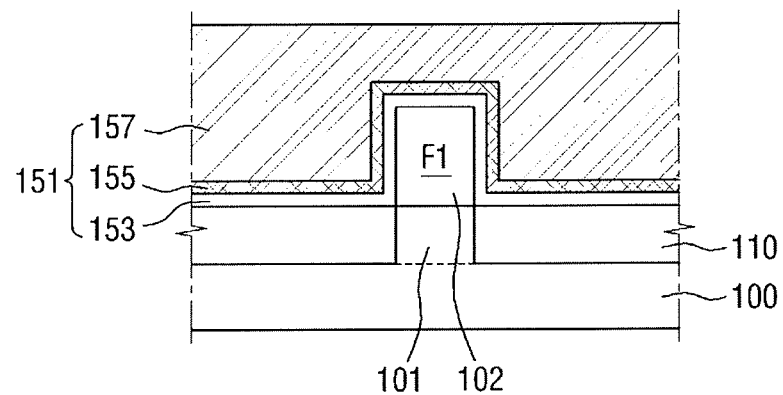

FIGS. 43 to 58 illustrate process steps of a method for fabricating a semiconductor device according to an exemplary embodiment of the present inventive concept. FIGS. 43, 44, 45, 48, 49, 50, 52 and 56 are perspective views of the semiconductor device according to an exemplary embodiment of the present inventive concept, FIG. 46 is a cross-sectional view taken along line A-A of FIG. 45, FIG. 47 is a cross-sectional view taken along line B-B of FIG. 45, FIG. 51 is a cross-sectional view taken along line A-A of FIG. 50, FIGS. 53 to 55 are cross-sectional views taken along line A-A of FIG. 52, FIG. 57 is a cross-sectional view taken along line A-A of FIG. 56, and FIG. 58 is a cross-sectional view taken along line B-B of FIG. 56.

Figure 43:
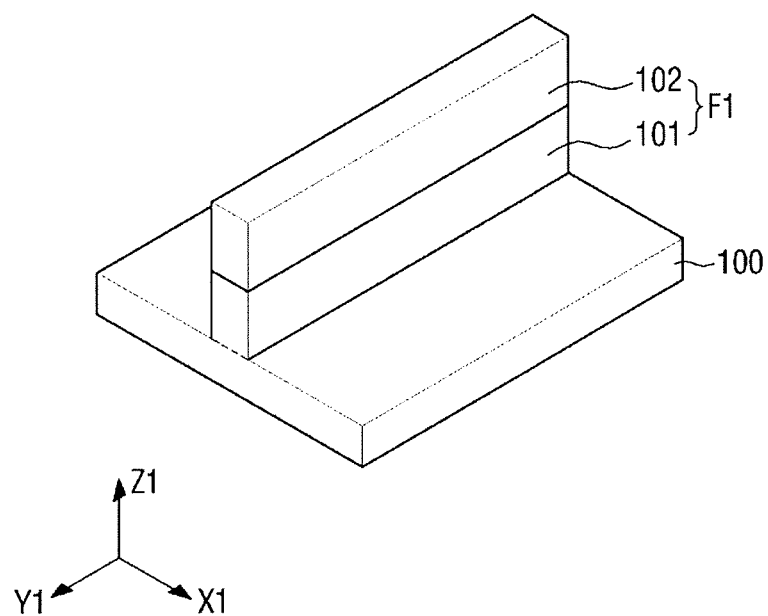
FIGS. 43 to 58 illustrate process steps of a method for fabricating a semiconductor device according to an exemplary embodiment of the present inventive concept.

First, referring to FIG. 43, a fin F1 is formed on a substrate 100. The fin F1 protrudes from the substrate 100 in a third direction Z1. The fin F1 extends in a lengthwise direction, that is, in a second direction Y1, having long sides of the second direction Y1 and short sides of a first direction X1. However, aspects of the present inventive concept are not limited thereto. For example, the fin F1 may have the first direction X1 as the long side direction and the second direction Y1 as the short side direction.

The fin F1 includes a lower region 101 and an upper region 102. For example, the lower region 101 is positioned on the substrate 100, and the upper region 102 is positioned on the lower region 101.

The lower region 101 and the upper region 102 include a first material and a second material at different concentrations. For example, the concentration of the first material in the lower region 101 may be smaller than the concentration of the first material in the upper region 102. In addition, the concentration of the second material in the lower region 101 may be greater than the concentration of the second material in the upper region 102.

Alternatively, the lower region 101 need not include the first material.

When the fin F1 is formed on the substrate 100 through epitaxial growth, a defect may be created in the fin F1. Here, the lower region 101 having a relatively low concentration of the first material is first formed on the substrate 100 and the upper region 102 having a higher concentration of the first material than the lower region 101 is then formed on the lower region 101, thereby forming the fin F1 without a defect.

The fin F1 may include an epitaxial layer grown from the substrate 100.

The substrate 100 may include the first material and the second material, or may include the second material only.

Figure 44:
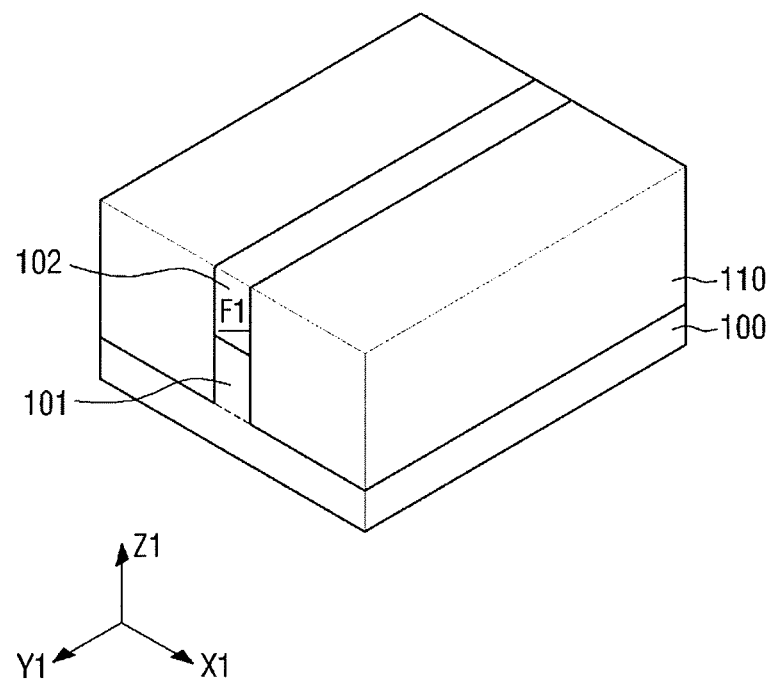

Referring to FIG. 44, a field insulation layer 110 is formed on the substrate 100 to cover sidewalls of the fin F1. The field insulation layer 110 may include at least one of a silicon oxide layer, a silicon nitride layer and a silicon oxynitride layer. The field insulation layer 110 covers sidewalls of the lower region 101 and the upper region 102.

Referring to FIGS. 45 to 47, a top portion of the field insulation layer 110 is recessed to expose a top portion of the fin F1. The recessing may be performed using a selective etching process.

Next, a dummy gate structure 111 crossing the fin F1 is formed on the fin F1. The dummy gate structure 111 includes a dummy gate insulation layer 113 and a dummy gate electrode 115. A dummy hard mask layer 117 is formed on the dummy gate structure 111.

Next, the spacer 121 is formed on both sidewalls of the dummy gate structures 111. The spacer 121 exposes a top surface of the dummy hard mask layer 117.

Figure 48:
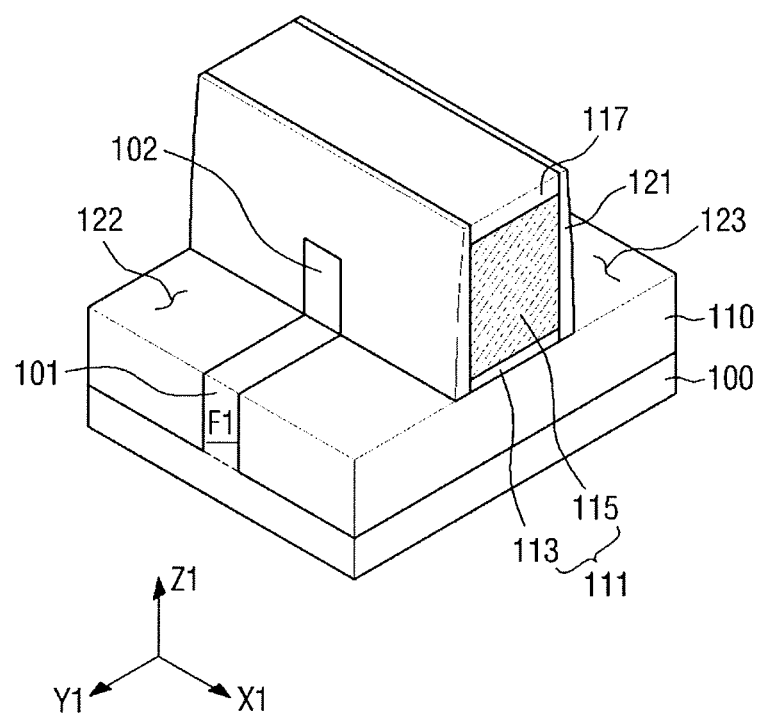

Referring to FIG. 48, the exposed fin F1 that is not covered by the dummy gate structure 111 is etched. The fin F1 is etched using the spacer 121 and the dummy gate structure 111 as etch masks. A first recess 122 and a second recess 123 are formed by etching the fin F1. A top surface of the lower region 101 is exposed by the first and second recesses 122 and 123 while exposing sidewalls of the upper region 102, that is, sidewalls of the channel region (C of FIG. 51) to the outside.

Figure 49:
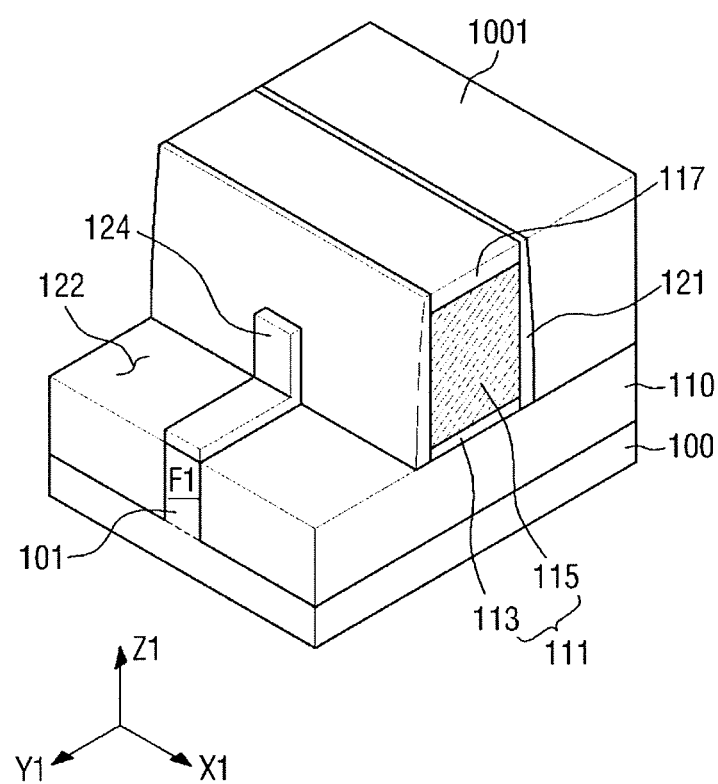

Referring to FIG. 49, the second recess 123 is covered by a mask 1001. In FIG. 49, the mask 1001 covering the second recess 123 and the sidewalls of the spacer 121 in the second recess 123 is illustrated, but aspects of the present inventive concept are not limited thereto. For example, the mask 1001 also covers a portion of the dummy hard mask layer 117.

Next, an oxide layer 124 is formed by oxidizing a surface of the fin F1 exposed by the first recess 122. The surface of the fin F1 may be oxidized at about 700° C. to about 800° C. For example, the top surface of the lower region 101 and the sidewalls of the upper region 102 may be oxidized. Here, the second material may be more reactive with oxygen on the surface of the fin F1 than the first material. Therefore, a concentration of the first material in the oxide layer 124 may be smaller than that of the second material in the oxide layer 124. However, since the concentration of the first material in the lower region 101 is relatively small, even if the second material reacts with oxygen, there may be little change in the concentration of the first material.

Figure 50:
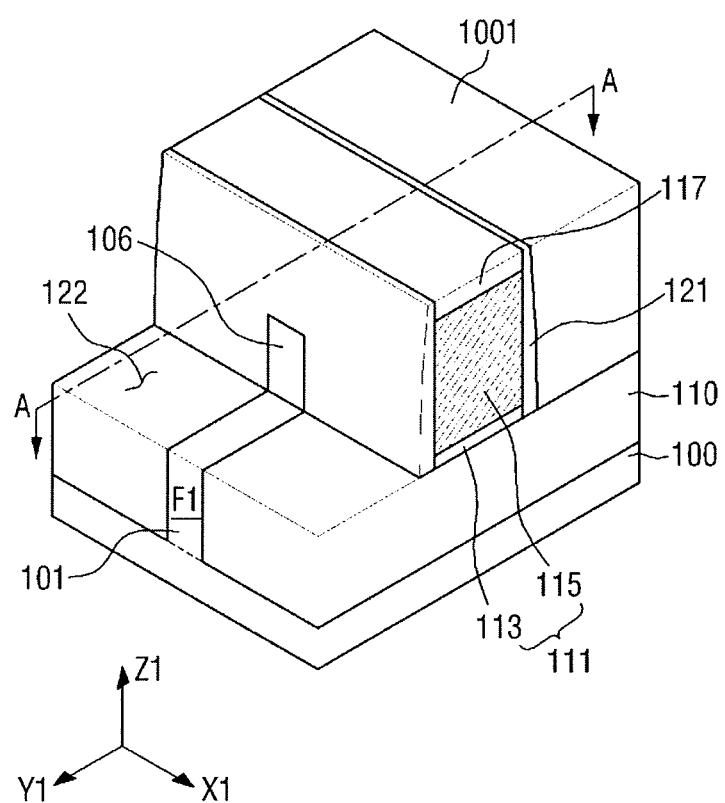
Figure 51:
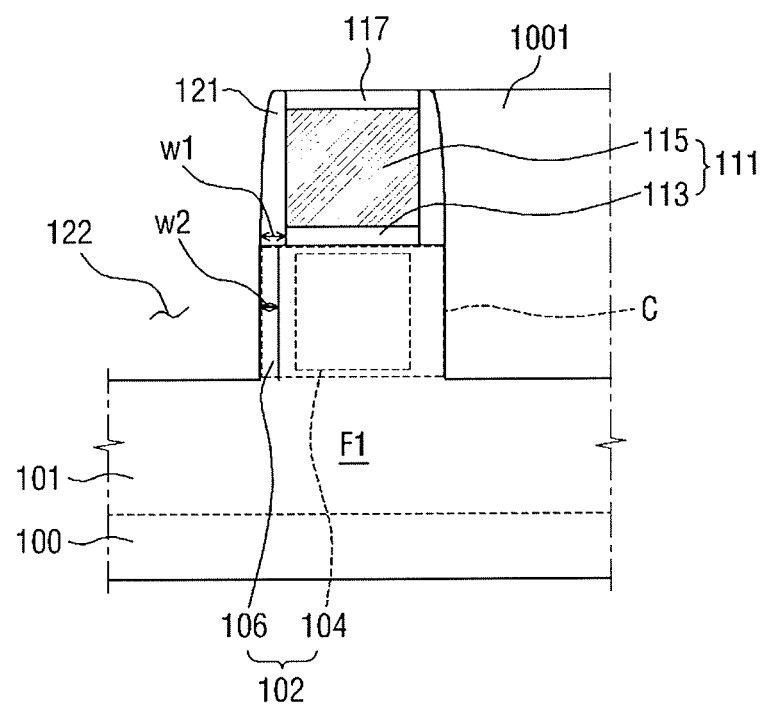
Figure 52:
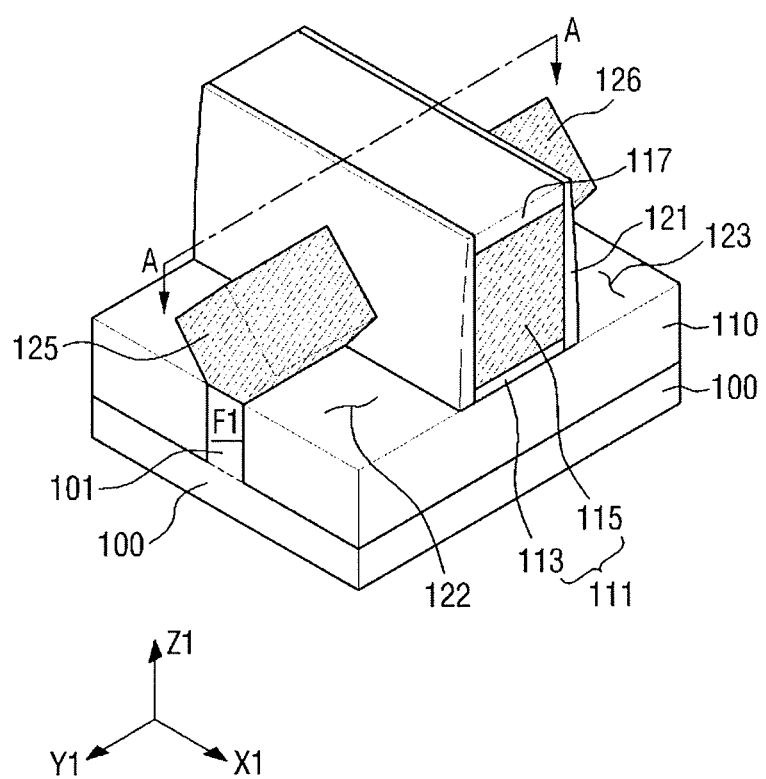

Referring to FIGS. 50 and 51, the oxide layer 124 is removed. The upper region 102 includes a first fin area 104 and a second fin area 106. The first fin area 104 and the second fin area 106 are formed by forming the oxide layer 124.

The first fin area 104 and the second fin area 106 are formed in the channel region C. For example, the first fin area 104 is formed under the dummy gate structure 111, and the second fin area 106 is formed on sidewalls of the channel region C, that is, on sidewalls of the first recess 122. The second fin area 106 extends to be substantially perpendicular to the substrate 100. The second fin area 106 is not formed in the lower region 101.

A width W2 of the second fin area 106 is smaller than a width W1 of the spacer 121 being in contact with the second fin area 106.

Since the second material is more oxidized than the first material in the second fin area 106, the concentration of the first material is higher in the second fin area 106 than in the first fin area 104. Therefore, the second concentration of the first material in the second fin area 106 may be higher than the first concentration of the first material in the first fin area 104. In addition, since the second material is more oxidized in the exposed surface of the fin F1 in the second fin area 106 than in other portions, the concentration of the first material in the second fin area 106 may gradually decrease from the exposed surface of the second fin area 106 to the first fin area 104.

Since the second material is not oxidized in the first fin area 104, the concentration of the first material and the concentration of the second material may be uniform throughout the first fin area 104. Likewise, the concentration of the second material may also be uniform.

The concentration of the second material in the second fin area 106 may be smaller than the concentration of the second material in the first fin area 104.

Figure 53:
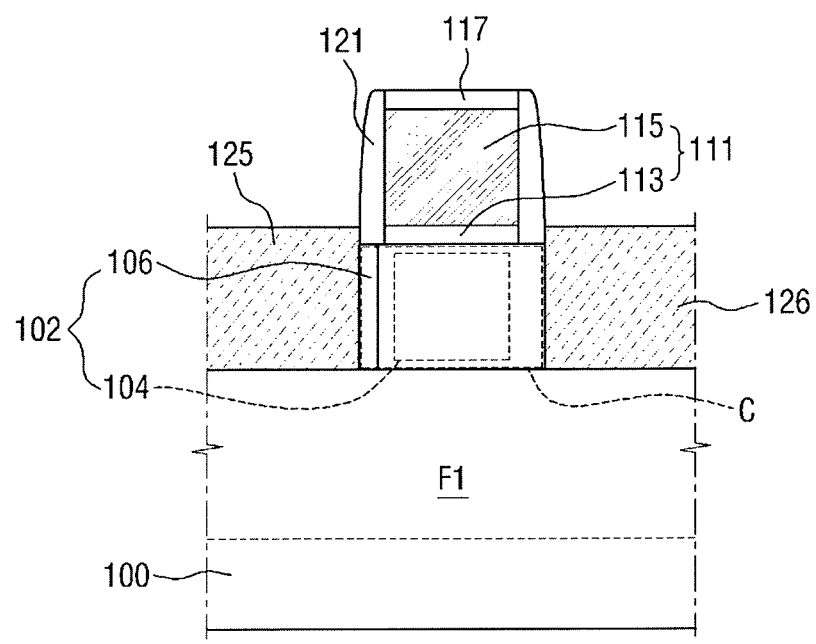

Referring to FIGS. 52 and 53, the mask 1001 is removed to expose the second recess 123.

Next, a source region 125 is formed in the first recess 122, and a drain region 126 is formed in the second recess 123. The source region 125 and the drain region 126 may be simultaneously formed. The channel region C is positioned between the source region 125 and the drain region 126.

The source region 125 and the drain region 126 are elevated source/drain regions. Therefore, as shown in FIG. 53, top surfaces of the source region 125 and the drain region 126 are higher than the top surface of the fin F1.

The source region 125 is in contact with the second fin area 106.

The source region 125 and the drain region 126 include a first material and a second material. A concentration of the first material in the source region 125 and a concentration of the first material in the drain region 126 may be greater than the second concentration of the first material in the second fin area 105. Since the source region 125 and the drain region 126 are simultaneously formed, the concentration of the first material in the source region 125 and the concentration of the first material in the drain region 126 may be substantially equal to each other.

The first material may increase mobility of carriers in the channel region C by applying compressive stress to the channel region C.

The source region 125 and the drain region 126 may be formed by epitaxial growth.

The source region 125 and the drain region 126 having a pentagonal shape are illustrated in FIG. 52, but aspects of the present inventive concept are not limited thereto. For example, the source region 125 and the drain region 126 may have rectangular, circular or hexagonal shapes.

Figure 54:
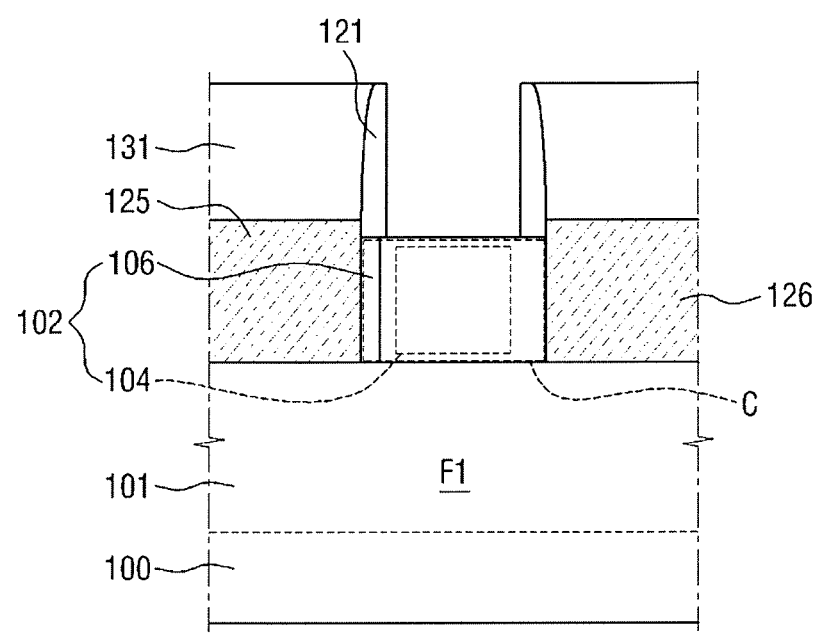

Referring to FIG. 54, a first interlayer insulation film 131 covering the source region 125 and the drain region 126 is formed to cover the sidewalls of the spacer 121.

Next, the dummy hard mask layer 117 and the dummy gate structure 111 are removed. The dummy hard mask layer 117 may be removed by a planarization process, but aspects of the present inventive concept are not limited thereto.

Figure 55:
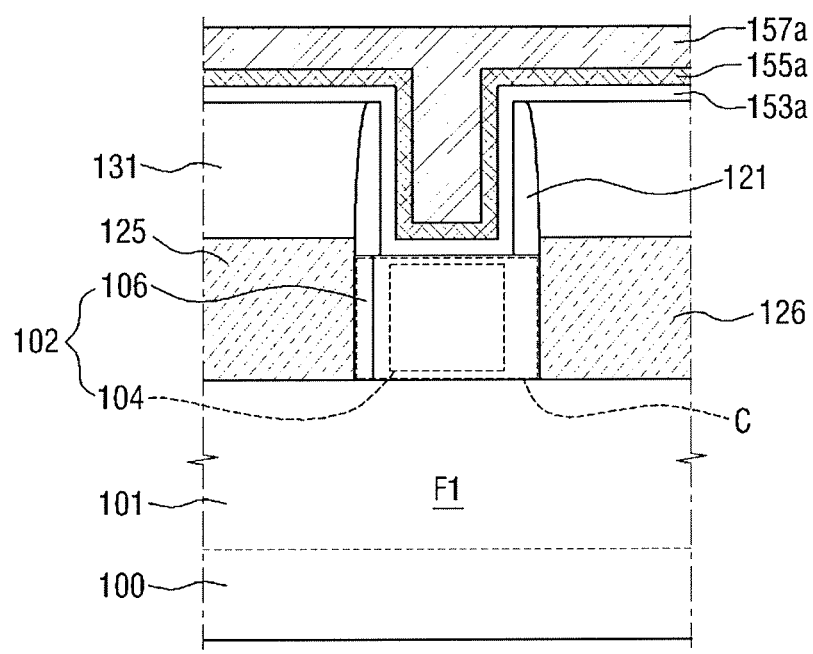

Referring to FIG. 55, a gate insulation layer 153a, and a first metal layer 155a and a second metal layer 157a constituting a gate electrode, are sequentially formed.

Referring to FIGS. 56 to 58, a gate structure 151 is formed. A planarization process is performed on the resulting structure of FIG. 55 to expose the first interlayer insulation film 131, thereby forming the gate structure 151 including the gate insulation layer 153, the first metal layer 155 and the second metal layer 157.

The gate structure 151 need not be in contact with the second fin area 106, and is spaced apart from the second fin area 106.

In an exemplary embodiment, the gate insulation layer 153 and the first metal layer 155 may be recessed between the spacers 121.

Referring back to FIGS. 6 to 8, the second interlayer insulation film 133 is formed on the first interlayer insulation film 131 to cover the gate structure 151. A contact hole is formed to expose the top surface of the source region 125 and the top surface of the drain region 126. The contact hole penetrates through the first and second interlayer insulation films 131 and 133. The silicide layer 191 is formed on the top surface of the source region 125 and the top surface of the drain region 126. The contact 193 filling the contact hole is formed on the silicide layer 191 to fabricate the semiconductor device 3 as shown in FIGS. 6 to 8.

Next, a semiconductor device according to an exemplary embodiment of the present inventive concept will be described with reference to FIGS. 9, 10, 43 to 48 and 59 to 69. The same content as described above will be omitted and the following description will focus on differences.

Figure 59:
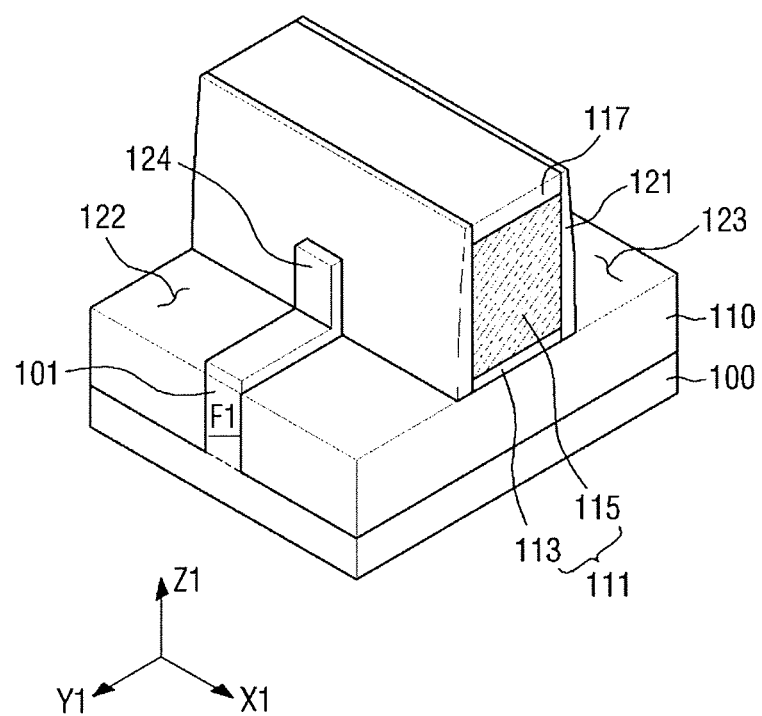
FIGS. 59 to 69 illustrate process steps of a method for fabricating a semiconductor device according to an exemplary embodiment of the present inventive concept.
Figure 60:
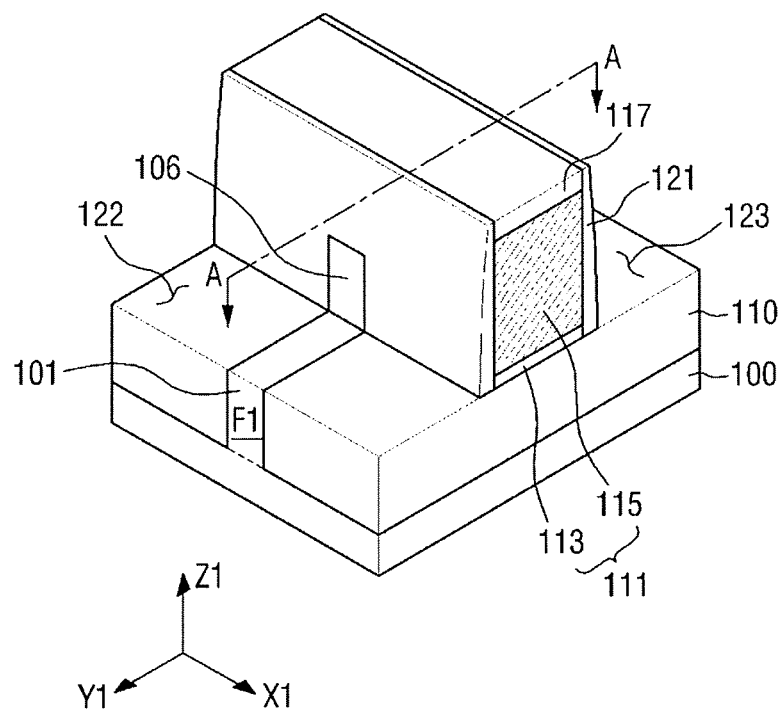
Figure 61:
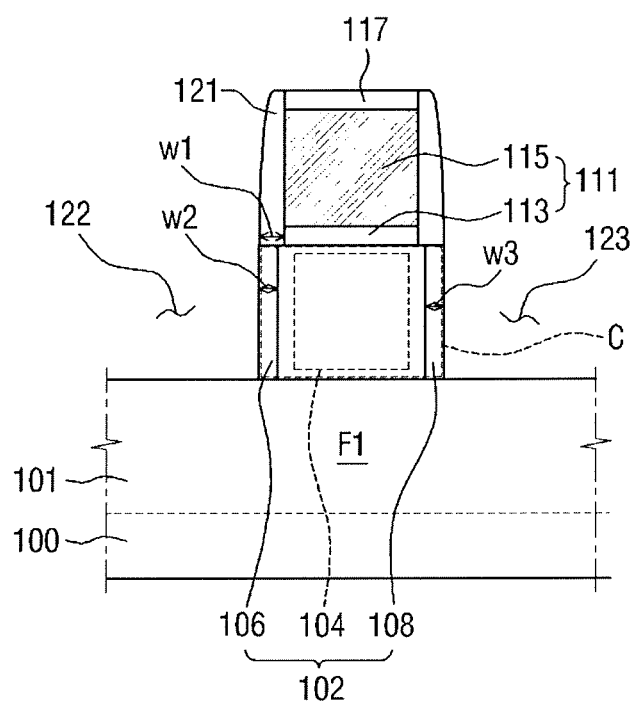
Figure 62:
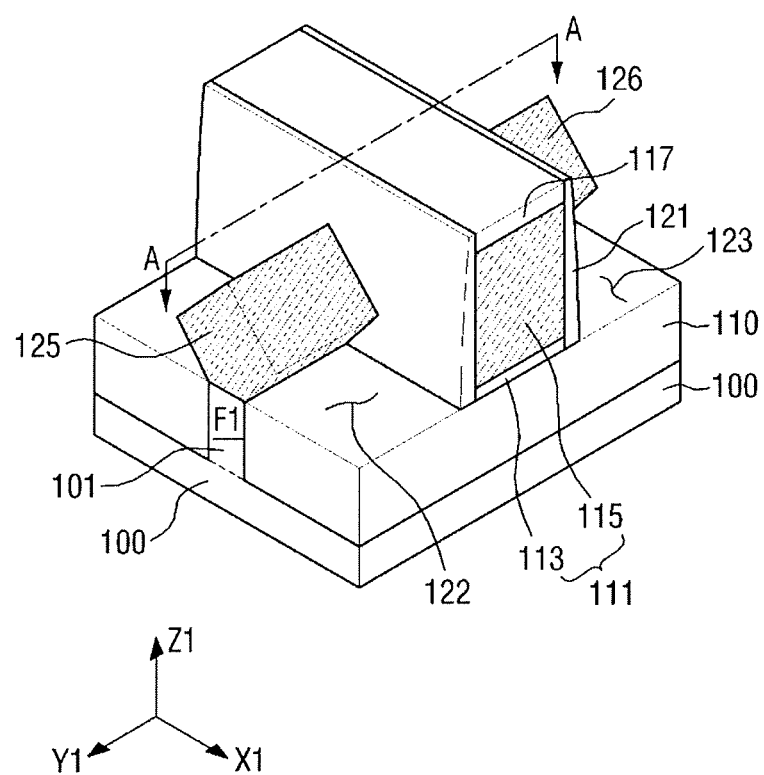
Figure 65:
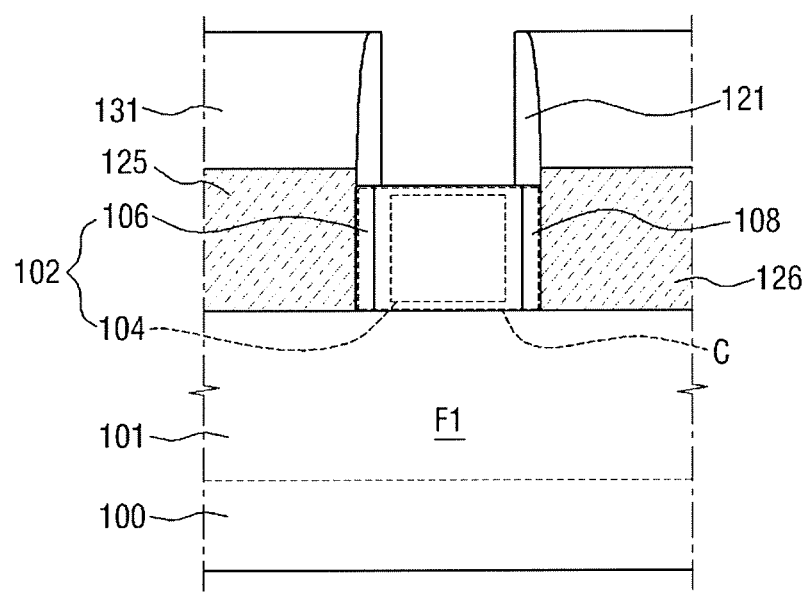
Figure 66:
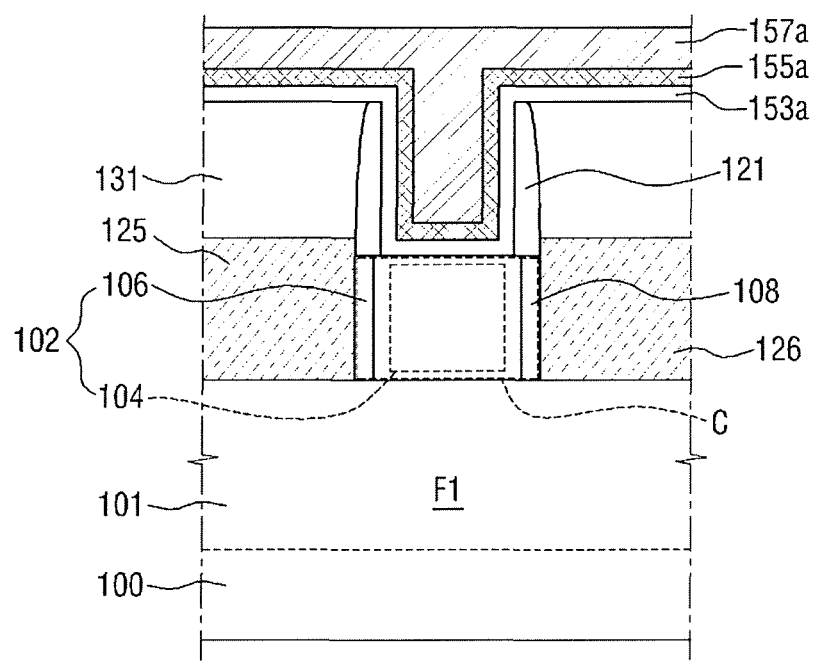
Figure 67:
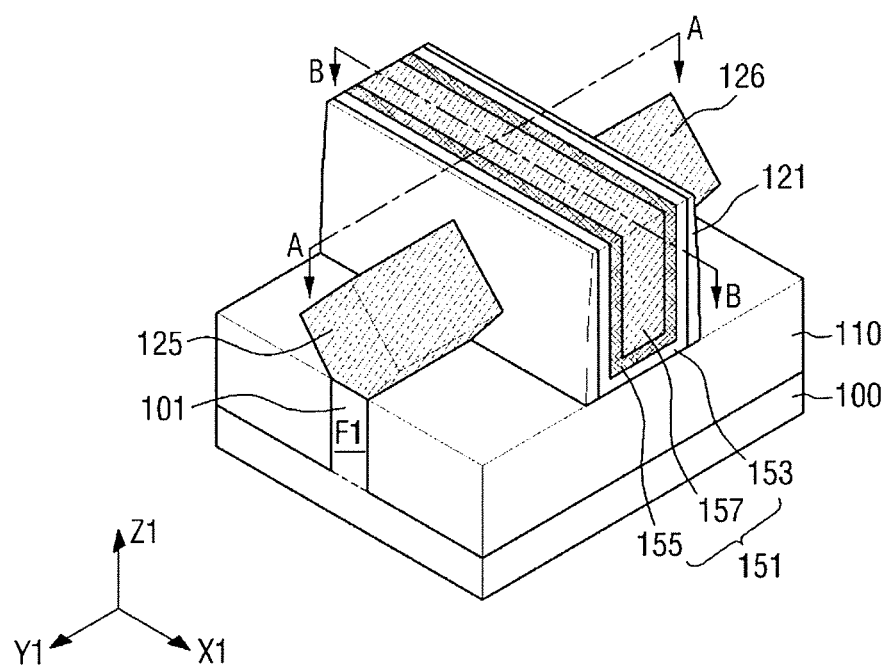
Figure 68:
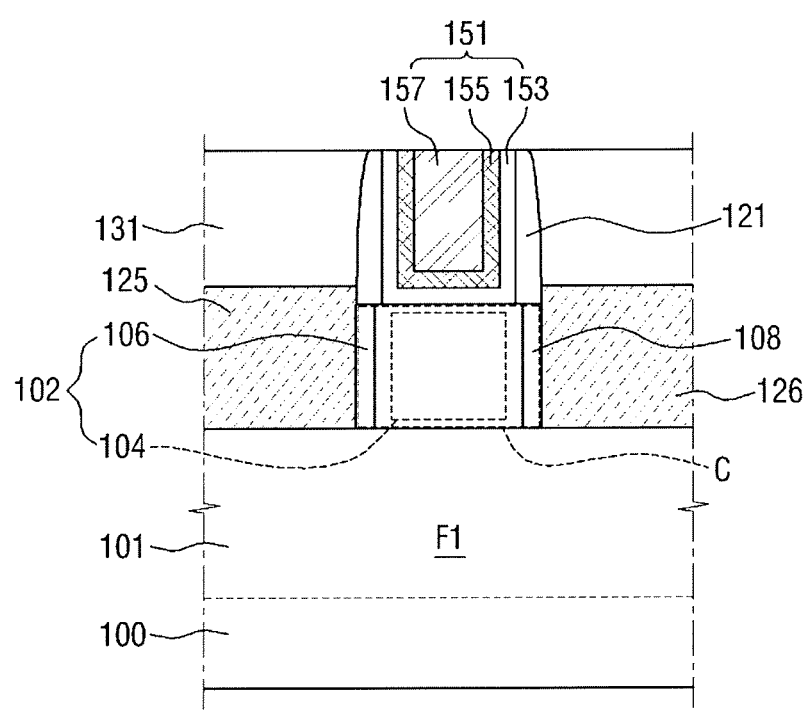
Figure 69:
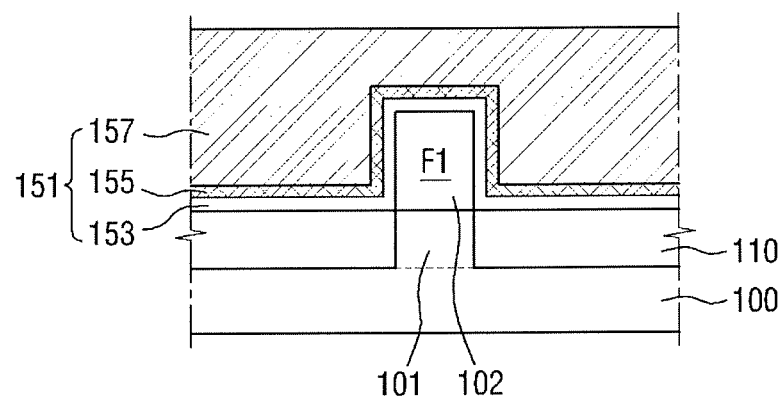

FIGS. 59 to 69 illustrate process steps of a method for fabricating a semiconductor device according to an exemplary embodiment of the present inventive concept. FIGS. 59, 60, 62 and 67 are perspective views of the semiconductor device according to an exemplary embodiment of the present inventive concept, FIG. 61 is a cross-sectional view taken along line A-A of FIG. 60, FIGS. 63 to 66 are cross-sectional views taken along line A-A of FIG. 62, FIG. 68 is a cross-sectional view taken along line A-A of FIG. 67, and FIG. 69 is a cross-sectional view taken along line B-B of FIG. 67.

Since descriptions of FIGS. 43 to 48 have already been made above, repeated descriptions thereof will be omitted.

Referring to FIG. 59, an oxide layer 124 is formed by oxidizing the surface of the fin F1 exposed by the first recess 122 and the second recess 123. Since the second recess 123 is not covered by the mask 1001, the oxide layer 125 is also formed on a surface of the second recess 123. The oxidizing may be performed at a temperature in a range of about 700° C. to about 800° C. The second material may be more reactive with oxygen than the first material.

Referring to FIGS. 60 and 61, the oxide layer 124 is removed, and a second fin area 106 and a third fin area 108 are formed on the upper region 102. The second fin area 106 is formed on sidewalls of the upper region 102 exposed by the first recess 122. The third fin area 108 is formed on the sidewalls of the upper region 102 exposed by the second recess 123. The second fin area 106 and the third fin area 108 extend to be substantially perpendicular to the substrate 100.

The first fin area 104 is positioned between the second fin area 106 and the third fin area 108. The first fin area 104, a portion of the second fin area 106 and a portion of the third fin area 108 constitute the channel region C.

The concentration of the first material in the lower region 101 is smaller than that in the upper region 102. Therefore, even if the top surface of the lower region 101 is oxidized, there may be little change in the concentration of the first material. The second fin area 106 and the third fin area 108 are formed on the upper region 102.

A width W2 of the second fin area 106 is smaller than a width W1 of the spacer 121 being in contact with the second fin area 106, and a width W3 of the third fin area 108 is smaller than the width W1 of the spacer 121 being in contact with the third fin area 108.

A second concentration of the first material in the second fin area 106 may be greater than a first concentration of the first material in the first fin area 104, and a third concentration of the first material in the third fin area 108 may be greater than the first concentration of the first material in the first fin area 104. Since the second fin area 106 and the third fin area 108 are simultaneously formed, the third concentration and the second concentration may be substantially equal to each other.

A concentration of the second material in the second fin area 106 may be smaller than a concentration of the second material in the first fin area 104, and a concentration of the second material in the third fin area 108 may be smaller than a concentration of the second material in the first fin area 104.

The second material may be more in the exposed surface of the fin F1 but may be less oxidized toward the interior side of the fin F1. Therefore, the concentration of the first material may gradually decrease from the second fin area 106 and the third fin area 108 to the exposed second fin area 106 and the surface of the third fin area 108 and to the first fin area 104.

Since the second material is not oxidized in the first fin area 104, the concentration of the first material may be uniform throughout the first fin area 104 and the concentration of the second material may also be uniform throughout the first fin area 104.

Figure 63:
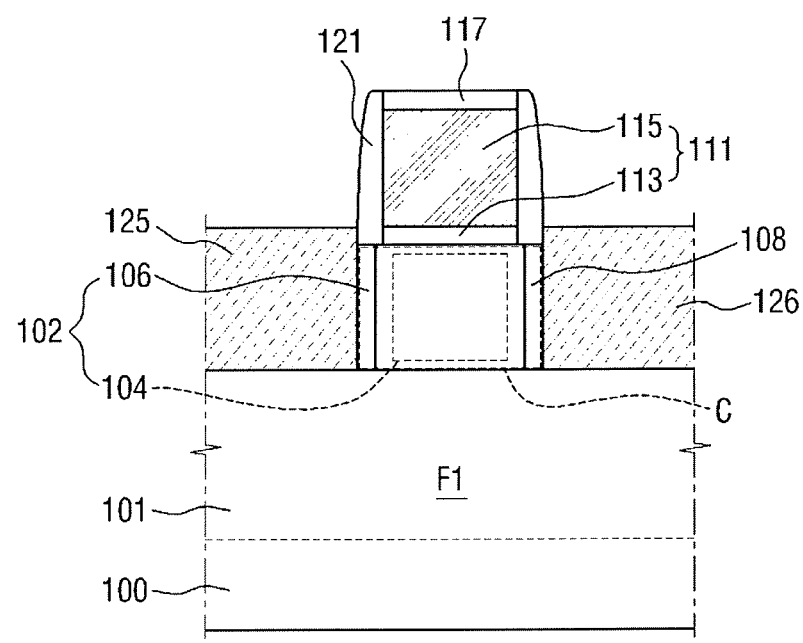

Referring to FIGS. 62 and 63, a source region 125 is formed in the first recess 122 and a drain region 126 is formed in the second recess 123. The source region 125 and the drain region 126 may be simultaneously formed. The channel region C is positioned between the source region 125 and the drain region 126.

The second fin area 106 may be in contact with the source region 125 and the third fin area 108 may be in contact with the drain region 126.

The source region 125 and the drain region 126 are elevated source/drain regions. Therefore, as shown in FIG. 63, top surfaces of the source region 125 and the drain region 126 are higher than the top surface of the fin F1.

The source region 125 and the drain region 126 include a first material and a second material. A concentration of the first material in the source region 125 and a concentration of the first material in the drain region 126 may be greater than the second concentrations of the first material in the second and third fin areas 106 and 108. Since the source region 125 and the drain region 126 are simultaneously formed, the concentration of the first material in the source region 125 and the concentration of the first material in the drain region 126 may be substantially equal to each other.

The first material may increase mobility of carriers in the channel region C by applying compressive stress to the channel region C.

The source region 125 and the drain region 126 are formed by epitaxial growth.

Figure 64:
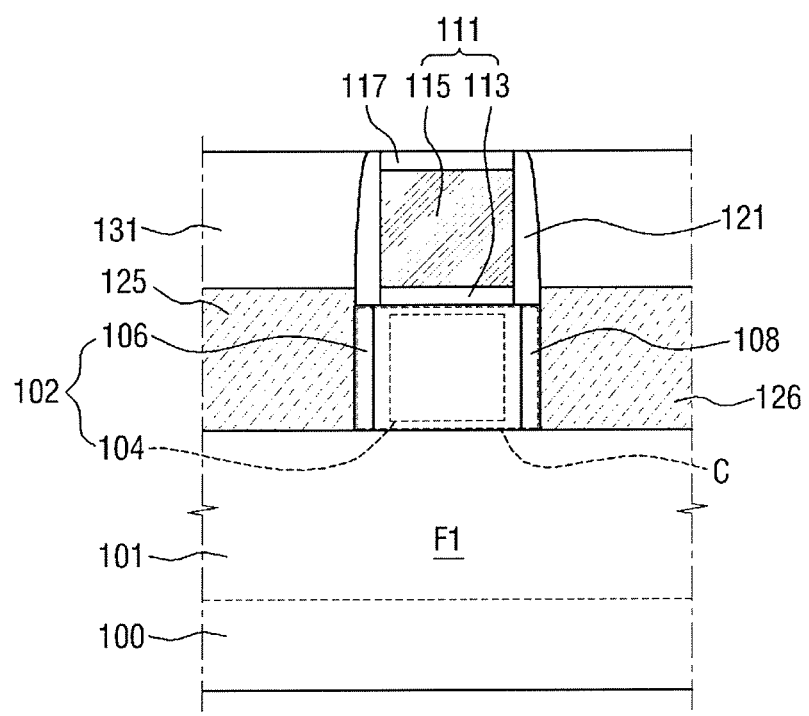

Referring to FIG. 64, a first interlayer insulation film 131 covering the source region 125 and the drain region 126 is formed. The first interlayer insulation film 131 covers the sidewalls of the spacer 121 while exposing a top surface of a dummy hard mask layer 117. The first interlayer insulation film 131 may include, for example, silicon oxide.

Referring to FIG. 65, the dummy hard mask layer 117 and the dummy gate structure 111 are removed. The dummy hard mask layer 117 may be removed by a planarization process.

Next, the channel region C formed in the fin F1 is exposed by removing the dummy gate electrode 115 and the dummy gate insulation layer 113. Sidewalls of the spacers 121 are exposed, and the channel region C is also exposed.

Referring to FIG. 66, a gate insulation layer 153a, and a first metal layer 155a and a second metal layer 157a constituting a gate electrode, are sequentially formed.

Referring to FIGS. 67 and 69, a gate structure 151 is formed. A planarization process is performed on the resulting structure of FIG. 66 to expose the first interlayer insulation film 131, thereby forming the gate structure 151 including the gate insulation layer 153, the first metal layer 155 and the second metal layer 157.

The gate structure 151 need not be in contact with the second and third fin areas 106 and 108, and is spaced apart from the second and third fin areas 106 and 108.

Referring back to FIGS. 9 and 10, the second interlayer insulation film 133 is formed on the first interlayer insulation film 131 to cover the gate structure 151. A contact hole is formed to expose the top surface of the source region 125 and the top surface of the drain region 126. The contact hole penetrates through the first and second interlayer insulation films 131 and 133. The silicide layer 191 is formed on the top surface of the source region 125 and the top surface of the drain region 126. The contact 193 filling the contact hole is formed on the silicide layer 191 to fabricate the semiconductor device 4 as shown in FIGS. 9 and 10.

Figure 70:
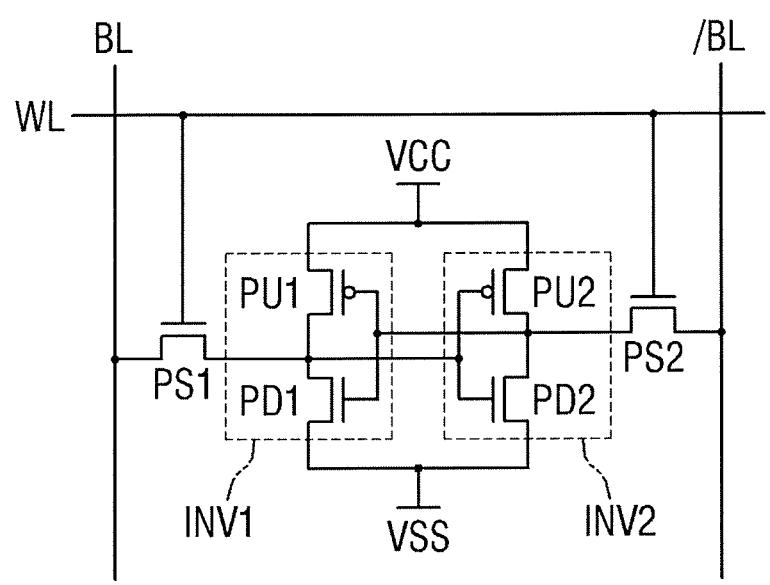
FIGS. 70 and 71 are a circuit view and a layout view illustrating semiconductor devices according to some embodiments of the present inventive concept.
Figure 71:
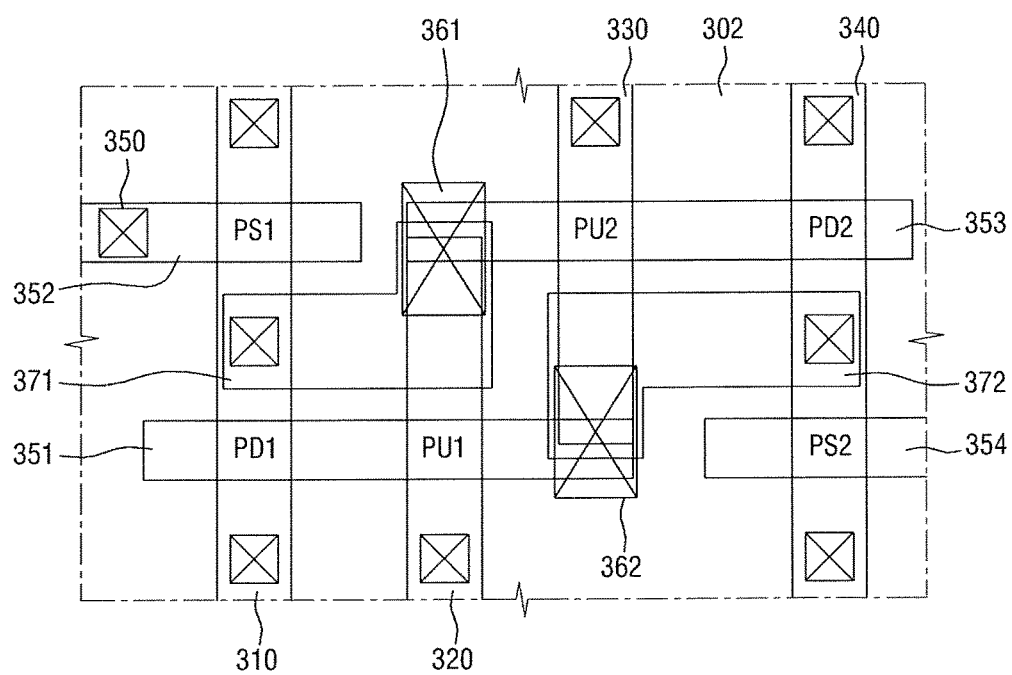

FIGS. 70 and 71 are a circuit diagram and a layout thereof illustrating a semiconductor device according to an exemplary embodiment of the present inventive concept.

While FIGS. 70 and 71 illustrate a static random access memory (SRAM) including a fin type transistor according to an exemplary embodiment, the present inventive concept is not limited thereto, and thus may be applied to other types of semiconductor devices.

Referring first to FIG. 70, the semiconductor device includes a pair of inverters INV1 and INV2 connected in parallel between a power supply node Vcc and a ground node Vss. A first pass transistor PS1 and a second pass transistor PS2 are connected to output nodes of the inverters INV1 and INV2. The first pass transistor PS1 and the second pass transistor PS2 are connected to a bit line BL and a complementary bit line BL. Gates of the first pass transistor PS1 and the second pass transistor PS2 are connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 are PMOS transistors, and the first pull-down transistor PD1 and the second pull-down transistor PD2 are NMOS transistors.

An input node of the first inverter INV1 is connected to an output node of the second inverter INV2. An input node of the second inverter INV2 is connected to an output node of the first inverter INV1. Such cross-coupled connection between the first inverter INV1 and the second inverter INV2 forms a latch circuit to store information.

Referring to FIGS. 70 and 71, a first fin 310, a second fin 320, a third fin 330 and a fourth fin 340, which are spaced apart from one another, extend lengthwise in one direction. The second fin 320 and the third fin 330 may extend in smaller lengths than the first fin 310 and the fourth fin 340.

In addition, a first gate electrode 351, a second gate electrode 352, a third gate electrode 353, and a fourth gate electrode 354 are formed to extend in the other direction to intersect the first fin 310 to the fourth fin 340. For example, the first gate electrode 351 completely intersects the first fin 310 and the second fin 320 and partially overlaps a terminal of the third fin 330. The third gate electrode 353 completely intersects the fourth fin 340 and the third fin 330 and partially overlaps a terminal of the second fin 320. The second gate electrode 352 and the fourth gate electrode 354 are formed to intersect the first fin 310 and the fourth fin 340, respectively.

As shown, the first pull-up transistor PU1 is defined in vicinity of an intersection of the first gate electrode 351 and the second fin 320, the first pull-down transistor PD1 is defined in vicinity of an intersection of the first gate electrode 351 and the first fin 310, and the first pass transistor PS1 is defined in vicinity of an intersection of the second gate electrode 352 and the first fin 310. The second pull-up transistor PU2 is defined in vicinity of an intersection of the third gate electrode 353 and the third fin 330, the second pull-down transistor PD2 is defined in vicinity of an intersection of the third gate electrode 353 and the fourth fin 340, and the second pass transistor PS2 is defined in vicinity of an intersection of the fourth gate electrode 354 and the fourth fin 340.

Although not specifically shown, recesses may be formed at opposite sides of the respective intersections of the first to fourth gate electrodes 351-354 and the first to fourth fins 310, 320, 330 and 340, and sources/drains may be formed in the recesses.

A plurality of contacts 350 is formed.

A first shared contact 361 simultaneously connects the second fin 320, the third gate electrode 353, and a wiring 371 with one another. A second shared contact 362 may simultaneously connect the third fin 330, the first gate electrode 351 and a wiring 372 with one another.

Figure 72:
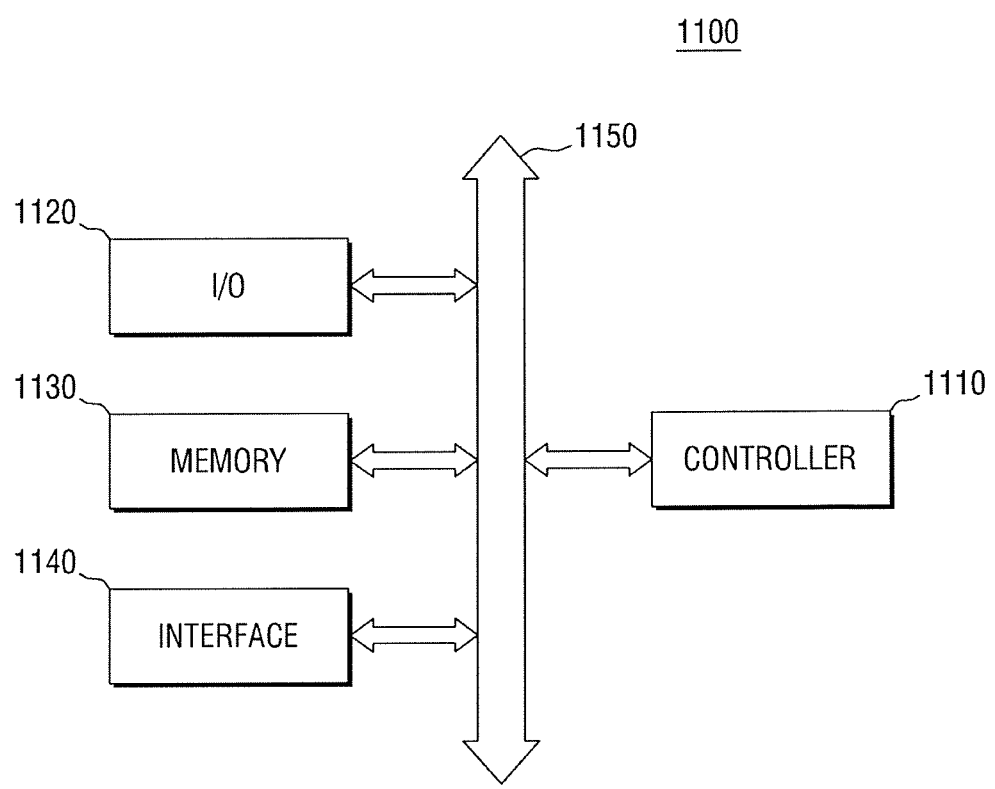
FIG. 72 is a block diagram of an electronic system including a semiconductor device according to an exemplary embodiment of the present inventive concept.

The first pull-up transistor PU1, the first pull-down transistor PD1, the first pass transistor PS1, the second pull-up transistor PU2, the second pull-down transistor PD2, and the second pass transistor PS2 may be fin type transistors according to an exemplary embodiment of the present inventive concept. FIG. 72 is a block diagram of an electronic system including semiconductor devices (1 to 6) according to some embodiments of the present inventive concept.

Referring to FIG. 72, the electronic system 1100 includes a controller 1110, an input/output device (I/O) 1120, a memory 1130, an interface 1140 and a bus 1150. The controller 11100, the I/O 1120, the memory 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed dynamic random access memory (DRAM) and/or SRAM as the working memory for the operation of the controller 1110. The memory 1130 or some components of the controller 1110 or the I/O 1120 may include a semiconductor device according to an exemplary embodiment of the present inventive concept.

The electronic system 1100 may be applied to a variety of different types of devices, such as personal digital assistants (PDAs), portable computers, web tablets, wireless phones, mobile phones, digital music players, memory cards, or all electronic products capable of transmitting/receiving information in wireless environments.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
    a substrate;
    a fin including a first material and a second material disposed on the substrate,
    wherein the first material includes Ge and the second material includes Si,
    wherein the fin is extended in a first direction substantially parallel to an upper surface of the substrate and protruded from the substrate in parallel to a second direction substantially perpendicular to the upper surface of the substrate, and
    wherein the fin includes a first fin area and a second fin area;
    a gate structure disposed on the first fin area and extended in a third direction substantially perpendicular to the first and second directions; and
    a source region being in contact with the second fin area,
    wherein the first fin area includes the first material at a first concentration,
    wherein the second fin area includes the first material at a second concentration which is greater than the first concentration,
    wherein the second concentration of the first material of the second fin area gradually decreases from a boundary between the source region and the second fin area toward the first fin area in parallel to the first direction.

2. The semiconductor device of claim 1,
    wherein the fin further includes a third fin area and a drain region which is in contact with the third fin area,
    wherein the first fin area is disposed between the second fin area and the third fin area, and
    wherein the third fin area includes the first material at a third concentration which is greater than the first concentration.

3. The semiconductor device of claim 2,
    wherein the second concentration is substantially equal to the third concentration.

4. The semiconductor device of claim 2,
    wherein the drain region includes the first material at a fourth concentration which is greater than the third concentration.

5. The semiconductor device of claim 1,
    wherein the source region includes the first material at a fifth concentration which is greater than the second concentration.

6. The semiconductor device of claim 1,
    wherein the second fin area surrounds the source region.

7. The semiconductor device of claim 1,
    wherein the second fin area is spaced apart from the gate structure.

8. The semiconductor device of claim 7, further comprising
    a spacer formed on a sidewall of the gate structure,
    wherein the spacer is disposed on the second fin area.

9. The semiconductor device of claim 8,
    wherein the second fin area is smaller than a lowermost part of the spacer in width.

10. The semiconductor device of claim 7,
    wherein a width of the gate structure is smaller than a width of the first fin area.

11. The semiconductor device of claim 1,
    wherein the source region further includes the second material, and
    wherein a concentration of the second material increases in the order of: the source region, the second fin area and the first fin area.

12. The semiconductor device of claim 1,
    wherein the first fin area includes the first material which is substantially uniformly distributed at the first concentration.

13. The semiconductor device of claim 1,
    wherein the fin includes a lower region and an upper region disposed on the lower region,
    wherein the upper region is extended in parallel to the second direction from the lower region so that an upper surface of the upper region is higher than an upper surface of the lower region from the upper surface of the substrate,
    wherein the upper region includes the first fin area and the second fin area, and
    wherein the source region is in contact with an upper surface of the lower region and a sidewall of the upper region.

14. The semiconductor device of claim 13,
    wherein a concentration of the first material in the lower region is smaller than a concentration of the first material in the upper region.

15. The semiconductor device of claim 13,
    wherein the lower region of the fin has a first width,
    wherein the upper region of the fin has a second width smaller than the first width, and
    wherein the first width and the second width are measured in parallel to the first direction.

16. The semiconductor device of claim 1,
    wherein the substrate includes the first material.

17. A semiconductor device comprising:
a fin structure disposed on a substrate,
wherein the fin structure, extending in a first direction substantially parallel to an upper surface of the substrate and protruded from the substrate in parallel to a second direction substantially perpendicular to the upper surface of the substrate, includes a channel region including Ge;
a gate structure disposed on the channel region, extending in a third direction substantially perpendicular to the first and second directions;
a source region being in contact with the channel region and including Ge; and
a gate spacer disposed on a sidewall of the gate structure and the source region,
wherein the channel region includes a first fin area and a second fin area,
wherein the first fin area and the second fin area are positioned under the gate structure and the gate spacer, respectively,
wherein the second fin area is in contact with the source region, extending in the third direction, and
wherein a concentration of Ge gradually decreases in the order of: the source region, the second fin area and the first fin area in parallel to the first direction.

18. The semiconductor device of claim 17, further comprising:
a drain region,
wherein the channel region further includes a third fin area which is in contact with the drain region and is positioned between the first fin area and the drain region, and
wherein a concentration of Ge in the third fin area is greater than a concentration of Ge in the first fin area.

19. The semiconductor device of claim 17,
wherein a concentration of Ge in the second fin area gradually decreases toward the first fin area.

* * * * *